United States Patent
Edwards

(10) Patent No.: US 12,550,366 B2
(45) Date of Patent: Feb. 10, 2026

(54) RUGGED LDMOS WITH REDUCED NSD IN SOURCE

(71) Applicant: TEXAS INSTRUMENTS INCORPORATED, Dallas, TX (US)

(72) Inventor: Henry Litzmann Edwards, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/096,679

(22) Filed: Jan. 13, 2023

(65) Prior Publication Data

US 2023/0170414 A1  Jun. 1, 2023

Related U.S. Application Data

(63) Continuation of application No. 17/329,334, filed on May 25, 2021, now Pat. No. 11,594,630.

(51) Int. Cl.
| | |
|---|---|
| H10D 30/65 | (2025.01) |
| H01L 21/225 | (2006.01) |
| H10D 30/01 | (2025.01) |
| H10D 30/60 | (2025.01) |
| H10D 62/17 | (2025.01) |
| H10D 84/83 | (2025.01) |

(52) U.S. Cl.
CPC ......... *H10D 30/65* (2025.01); *H01L 21/2253* (2013.01); *H10D 30/0281* (2025.01); *H10D 30/603* (2025.01); *H10D 62/393* (2025.01); *H10D 84/83* (2025.01)

(58) Field of Classification Search
CPC .......... H10D 30/0221; H10D 30/0281; H10D 30/65; H10D 62/127; H10D 62/151; H10D 62/371; H10D 62/392; H10D 64/516; H10D 84/83
USPC ....................................................... 257/336
See application file for complete search history.

(56) References Cited

U.S. PATENT DOCUMENTS

| | | | | |
|---|---|---|---|---|
| 5,346,835 | A | * | 9/1994 | Malhi .................. H10D 30/603 257/E27.06 |
| 5,736,766 | A | * | 4/1998 | Efland ............... H01L 29/66681 257/341 |

(Continued)

FOREIGN PATENT DOCUMENTS

CN  106847894 A  6/2017

*Primary Examiner* — Fazli Erdem
(74) *Attorney, Agent, or Firm* — Andrew R. Ralston; Frank D. Cimino

(57) ABSTRACT

An integrated circuit has a P-type substrate and an N-type LDMOS transistor. The LDMOS transistor includes a boron-doped diffused well (DWELL-B) and an arsenic-doped diffused well (DWELL-As) located within the DWELL-B. A first polysilicon gate having first sidewall spacers and a second polysilicon gate having second sidewall spacers are located over opposite edges of the DWELL-B. A source/IBG region includes a first source region adjacent the first polysilicon gate, a second source region adjacent the second polysilicon gate, and an integrated back-gate (IBG) region located between the first and second source regions. The first source region and the second source region each include a lighter-doped source sub-region, the IBG region including an IBG sub-region having P-type dopants, and the source/IBG region includes a heavier-doped source sub-region.

20 Claims, 20 Drawing Sheets

(56) References Cited

U.S. PATENT DOCUMENTS

| | | | |
|---|---|---|---|
| 5,811,850 A * | 9/1998 | Smayling | H01L 29/7816 |
| | | | 257/E27.06 |
| 9,461,046 B1 | 10/2016 | Edwards et al. | |
| 9,583,612 B1 | 2/2017 | Edwards et al. | |
| 10,461,182 B1 | 10/2019 | Edwards et al. | |
| 10,903,356 B2 * | 1/2021 | Edwards | H01L 29/7835 |
| 2004/0251492 A1 * | 12/2004 | Lin | H01L 29/66689 |
| | | | 257/E21.345 |
| 2011/0024839 A1 * | 2/2011 | Zinn | H10D 62/153 |
| | | | 438/286 |
| 2014/0048879 A1 * | 2/2014 | Qian | H10D 30/0281 |
| | | | 438/286 |
| 2017/0162690 A1 | 6/2017 | Edwards et al. | |
| 2017/0222042 A1 * | 8/2017 | Lee | H01L 29/7817 |
| 2019/0148517 A1 | 5/2019 | Edwards et al. | |
| 2020/0006549 A1 | 1/2020 | Sadovnikov et al. | |
| 2020/0006550 A1 | 1/2020 | Todd et al. | |

* cited by examiner

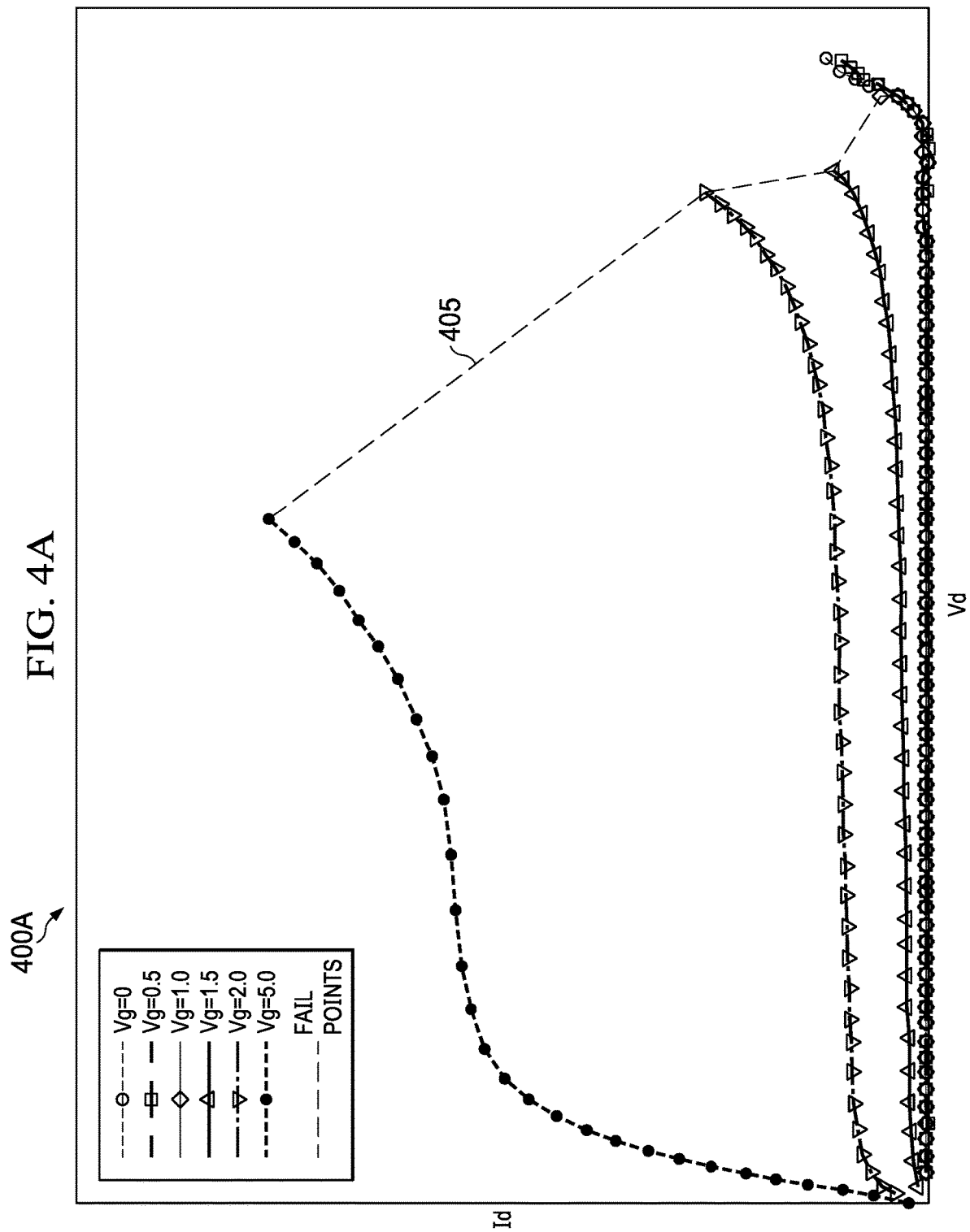

RUGGED LDMOS WITH REDUCED NSD IN SOURCE

CROSS REFERENCE TO RELATED APPLICATIONS

This application is a divisional of U.S. Pat. No. 11,594,630, which is incorporated by reference herein in its entirety.

BACKGROUND

Laterally diffused metal oxide semiconductor (LDMOS) power transistors are used in applications such as switching DC-DC converters, where ruggedness is desirable to enable device survival during exceptional conditions, such as load transients, short-circuit currents, and negative current flow. At the same time, a low specific on-resistance (Rsp) must be maintained to minimize cost, because Rsp dictates die size at a given source/drain on-resistance (RDSon). For advanced low-Rsp LDMOS architectures, it frequently is difficult to maintain sufficient ruggedness, e.g. device survival during transient events in which the drain undergoes avalanche breakdown. For high-side LDMOS hard-switching turnoff, it is particularly important that the drain voltage Vd at failure be above the drain-source saturation breakdown voltage (BVdss).

SUMMARY

Disclosed implementations provide an LDMOS transistor or set of transistors that contains or each contain a P-type diffused well (DWELL-P), surrounding an N-type DWELL (DWELL-N), with the DWELL-P and the DWELL-N lying between two parallel gates. The DWELL-P forms the body and channel of the LDMOS transistor(s); an N-type source/drain (NSD) implant and a P-type source/drain (PSD) implant into the DWELL-N can form a source, source contacts, and integrated back-gate (IBG). The source regions may contain heavier-doped source sub-regions that receive the NSD implant and lighter-doped source sub-regions that do not receive the NSD implant and only contain the doping of the DWELL-N. Removing all or portions of the NSD implant reduces the counter-doping of the DWELL-P and allows a parasitic NPN bipolar junction transistor (BJT) that is inherent in the LDMOS transistor to maintain a lower base resistance. Lower resistance in the body of the LDMOS transistor is combined with connections between the body region and the source region to maintain similar voltages and prevent turn-on of the parasitic NPN BJT, providing greater avalanche current immunity. These beneficial results are surprising in that they go against long-standing processes that use uniformly high levels of doping throughout the source region of LDMOS transistors to ensure desired conductivity, as further discussed below.

In some implementations, a solid PSD stripe layout can be provided in the IBG region to further reduce the base resistance of the parasitic NPN BJT. Staggered contacts can be centered on the PN junctions within the source/IBG region, rather than forming a straight row of contacts centered in the IBG region; the staggered contacts may reduce the need for current to flow across the body-source PN junction.

In one aspect, an implementation of an integrated circuit is disclosed. The integrated circuit includes a P-type semiconductor substrate having a first surface and a second surface opposite the first surface and an LDMOS transistor. The LDMOS transistor includes a diffused well having boron doping (DWELL-B) located at the first surface; a diffused well having arsenic doping (DWELL-As) located at the first surface and within the DWELL-B region; a first polysilicon gate located over a first edge of the DWELL-B, the first polysilicon gate having first sidewall spacers that laterally isolate the first polysilicon gate; a second polysilicon gate located over a second edge of the DWELL-B that is opposite the first edge, the second polysilicon gate having second sidewall spacers that laterally isolates the second polysilicon gate; and a source/IBG region that includes a first source region, a second source region, and an integrated back-gate (IBG) region, the first source region located within the DWELL-As region adjacent the first surface of the substrate and adjacent the first polysilicon gate, the second source region located within the DWELL-As region adjacent the first surface of the substrate and adjacent the second polysilicon gate, and the IBG region located in the DWELL-As region adjacent the first surface and between the first source region and the second source region, the IBG region including an IBG sub-region having P type dopants, the first source region and the second source region each including a respective lighter-doped source sub-region, and the source/IBG region including a heavier-doped source sub-region, the heavier-doped source sub-region having N-type dopants at a first concentration that is greater than about $1.0\times10^{20}$ atoms/cm$^3$ and a first junction depth that is greater than about 0.1 microns, and the lighter-doped source sub-region having N type dopants at a second concentration that is less than the first concentration and has a second junction depth that is less than the first junction depth.

In another aspect, an implementation of an integrated circuit formed on a semiconductor wafer, the IC including an LDMOS transistor is disclosed. The integrated circuit includes a semiconductor substrate having a first conductivity type, a first surface, and a second surface opposite the first surface; a drain region located at the first surface, the drain region including a drift region that forms a closed loop surrounding a drain contact region and a field relief oxide formed in the drift region and forming a closed loop around the drain contact region, the drain region having a second conductivity type; a first double diffused well located at the first surface and adjacent a first side of the drift region; a second double diffused well located at the first surface and adjacent a second side of the drift region opposite the first side, each of the first double diffused well and the second double diffused well including a first diffused well (DWELL) having doping of the first conductivity type and a second DWELL having doping of the second conductivity type, each of the second DWELLs contained within the respective first DWELL; a first source/integrated backgate (IBG) region located within the second DWELL of the first double diffused well and a second source/IBG region located within the second DWELL of the second double diffused well, each of the first source/IBG region and the second source/IBG region including a respective source region and a respective IBG region, the respective source region located between the respective IBG region and the drain region; and a polysilicon gate that forms a closed loop, an inner edge of the polysilicon gate located over the field relief oxide and an outer edge of the polysilicon gate having a first side that extends slightly over a respective source region of the first source/IBG region and a second side that extends slightly over a respective source region of the second source/IBG region, the respective source regions having a respective lighter-doped source sub-region and the IBG region including an IBG sub-region having dopants of the first conductivity type, the respective source/IBG regions including respective heavier-doped source sub-regions including dopants having the second conductivity type at a first concentration, the lighter-doped source sub-regions including dopants having the second conductivity type at a second concentration, the first concentration about ten times greater than the second concentration.

In yet another aspect, an implementation of a method of fabricating an integrated circuit that includes an N-type LDMOS transistor is disclosed. The method includes providing a P-type semiconductor substrate having a first N-type drift region and a second N-type drift region located at a first surface thereof, a first polysilicon gate located at least partially over the first N-type drift region, and a second polysilicon gate located at least partially over the second N-type drift region; forming a first mask and implanting both P-type dopants and N-type dopants through the first mask to form a first implanted well that is P-type and a second implanted well that is N-type; annealing the semiconductor substrate to form a diffused well with P type dopants (DWELL-P) and a diffused well with N-type dopants (DWELL N) within the DWELL-P; forming first sidewall spacers on lateral sides of the first polysilicon gate and second sidewall spacers on lateral sides of the second polysilicon gate; forming a second mask and performing an N-type source/drain (NSD) implant through the second mask, creating heavier-doped source sub-regions in a source/IBG region, the source/IBG region extending between the first sidewall spacers and the second sidewall spacers; and forming a third mask and performing a P-type source/drain (PSD) implant, creating IBG sub-regions in the source/IBG region, the heavier-doped source sub-regions and the IBG sub-regions defining lighter-doped source sub-regions that receive neither the NSD implant nor the PSD implant.

BRIEF DESCRIPTION OF THE DRAWINGS

Implementations of the present disclosure are illustrated by way of example, and not by way of limitation, in the figures of the accompanying drawings in which like references indicate similar elements. It should be noted that different references to "an" or "one" implementation in this disclosure are not necessarily to the same implementation, and such references may mean at least one. Further, when a particular feature, structure, or characteristic is described in connection with an implementation, it is submitted that it is within the knowledge of one skilled in the art to effect such feature, structure, or characteristic in connection with other implementations whether or not explicitly described.

The accompanying drawings are incorporated into and form a part of the specification to illustrate one or more exemplary implementations of the present disclosure. Various advantages and features of the disclosure will be understood from the following Detailed Description taken in connection with the appended claims and with reference to the attached drawing figures in which:

FIG. 4A provides results from transmission line pulse (TLP) testing for a baseline LDMOS transistor;

DETAILED DESCRIPTION OF THE DRAWINGS

Specific implementations of the invention will now be described in detail with reference to the accompanying figures. In the following detailed description of implementations of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

A buck converter, also known as a step-down converter, is a DC-to-DC power converter that steps down voltage from an input power supply to an output load. Due to stray capacitance and stray inductance from the package and the board containing the circuit, which may result in LC oscillation, buck converters can suffer switch-node ringing. During this ringing, the voltage on an output node may rise higher than the input voltage, which causes drain voltage stress on both the high-side and the low-side LDMOS FETs. The frequency and amplitude of this over-voltage swing, as well as the ruggedness of the transistors, determines how well the transistors operate over time. A rugged transistor is better able to withstand this stress.

Tests of ruggedness for LDMOS transistors usually refer to a device's capability to withstand severe load mismatch conditions at high output-power levels without performance degradation or device failure. When a transistor operates into a mismatched load, much of its output power is reflected back into the device where it must be dissipated in the transistor; if the power is high enough, the reflected power will damage components of the transistor. One way in which this destruction can occur in the LDMOS transistor is for a parasitic NPN BJT in the channel region to turn on. Because the NPN BJT is inherent in the structure of the LDMOS transistor, the parasitic transistor cannot be eliminated, but the resultant effects can be mitigated.

Figure 1A:
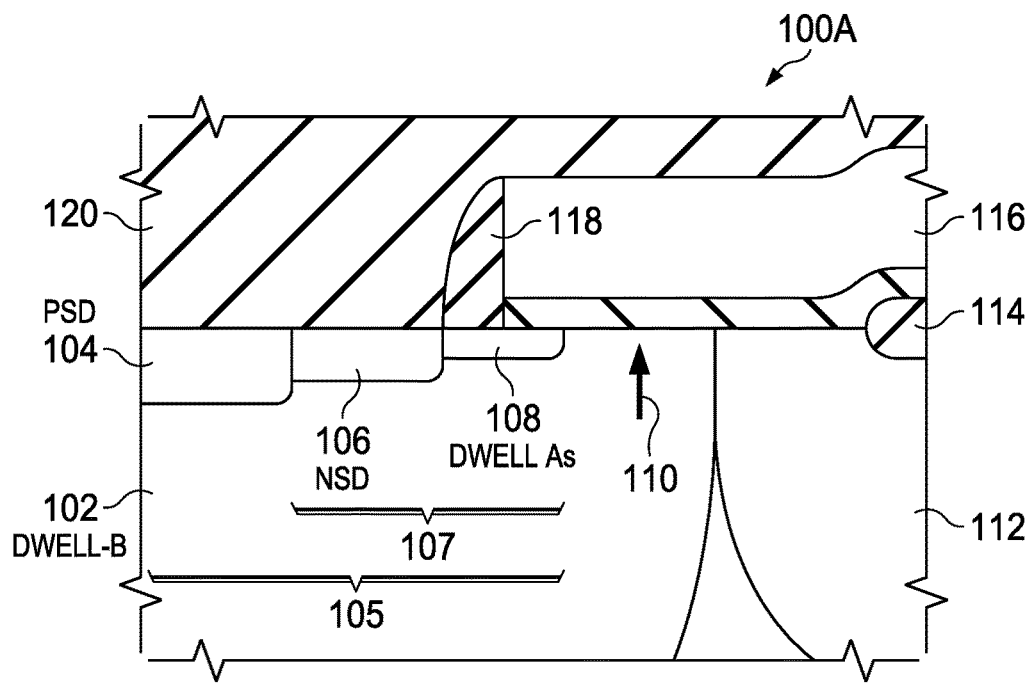
FIG. 1A depicts a close-up view of the source/channel region according to a baseline implementation of an LDMOS transistor.

FIG. 1A depicts a cross-section of a portion of a baseline LDMOS transistor 100A. The portion of the baseline LDMOS transistor 100A seen in FIG. 1A includes a diffused well having boron doping (DWELL-B) 102, a contact region to the DWELL-B region (also known as a back-gate) formed by a PSD region 104, a source region 107 that includes an NSD region 106 and a diffused well having arsenic doping (DWELL-As) 108, a channel region 110, a drift region 112, a LOCOS structure 114, a polysilicon gate 116, a sidewall spacer 118, and a pre-metal dielectric 120. Although the examples shown herein and discussed in greater detail below are of a drain-centered LDMOS transistor, the present discussion focuses on the PSD region 104, the NSD region 106, and the DWELL-As 108, which are collectively referred to herein as a source/IBG region 105. As will be shown in later figures, the elements of the baseline LDMOS transistor 100A are generally formed as elongated structures and regions that run in parallel in a direction orthogonal to the figure shown, although some structures, e.g., the drift region 112 and the LOCOS structure 114, may form a closed loop, also known as a 'racetrack' shape. It will be shown that the source/IBG region 105 in FIG. 1A may be only a section of the complete source/IBG region 105, with a second source region (not specifically shown) formed on the opposite side of the PSD 104, adjacent a second gate and drift region.

With regard to the source/IBG region 105, an understanding of the formation of the separate elements may guide the discussion. The baseline LDMOS transistor 100A may be formed in a manner that is generally integrated with the steps utilized to form regular complementary metal-oxide-semiconductor (CMOS) transistors, so that a number of additional masks and steps may be minimized during fabrication. After the formation of the drift region 112 and the LOCOS structure 114, the polysilicon gate 116 can be fabricated at the same time as polysilicon gates for CMOS transistors. An opening of a mask corresponding to the region that will become the source/IBG region 105 is aligned with the polysilicon gate 116 to form a resist level so that the polysilicon gate 116 acts as part of the mask, ensuring that the entire source/IBG region 105 is exposed. Both P-type dopants and N-type dopants are implanted through the opening in the resist level. In the present disclosure, the P-type dopants may be boron and the N-type dopants may be arsenic, although it will be understood that other P-type and N-type dopants can be used. As the substrate is annealed following removal of the mask, the dopants diffuse and form the DWELL-B 102 and the DWELL-As 108, with the arsenic dopants diffusing only a short distance so that it extends slightly under the polysilicon gate 116, while the boron dopants diffuse further, forming the larger DWELL-B region that includes the channel region 110. In one implementation, the DWELL-B 102 and the DWELL-As 108 can be formed prior to formation of the polysilicon gate 116. In this implementation, the self-aligned relationship between the N-type dopants and the P-type dopants is provided by use of the same photomask and does not rely on use of the polysilicon gate 116 as part of the mask. No matter which method is used to simultaneously form the two DWELLs, a combination such as the DWELL-B 102 and the DWELL-As 108 can be referred to as a double diffused well.

The self-alignment relationship between the DWELL-As 108 and the co-implanted DWELL-B 102 forms the channel region 110 with a graded P-type body doping, allowing high reverse voltage blocking capability while providing a built-in electric field to accelerate electrons from the source 107 to a drain, shown in FIG. 1A as the drift region 112. After formation of the sidewall spacers 118, NSD dopants and PSD dopants are implanted to form contact regions and complete the source/IBG region 105. As will be seen below, the NSD implant is self-aligned to the sidewall spacer 118 and provides a low series resistance connection to the source region 107, which may receive a layer of silicide (not explicitly shown). However, the NSD implant also counter-dopes part of the DWELL-B 102 and increases the possibility of triggering the parasitic transistor that is inherent in the baseline LDMOS transistor 100A and adversely affecting the ruggedness of the chip containing the baseline LDMOS transistor 100A.

Figure 1B:
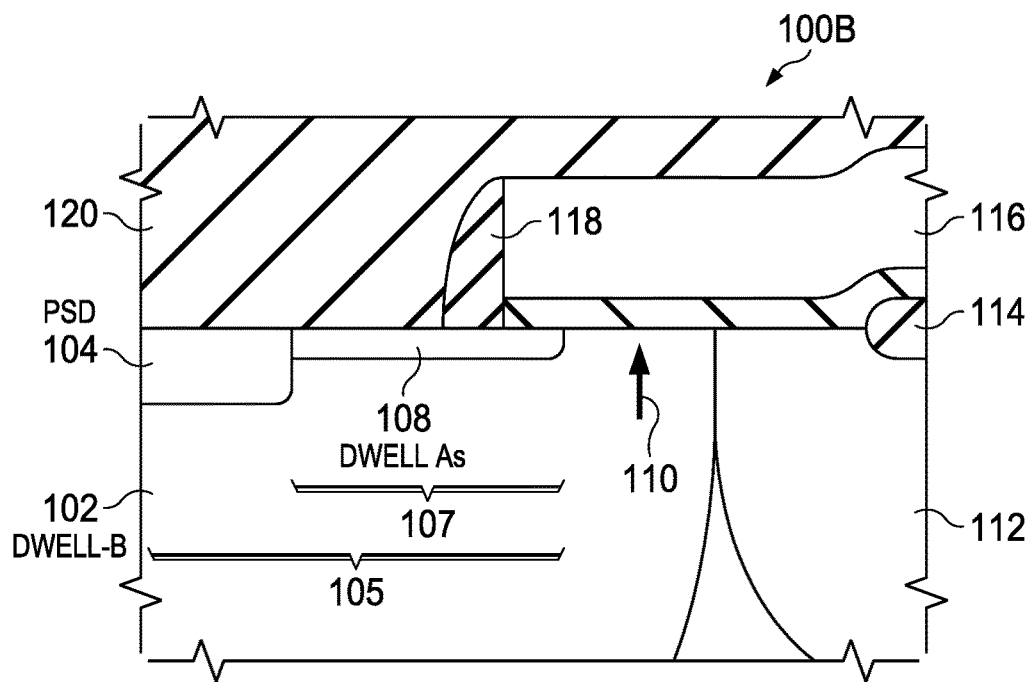
FIG. 1B depicts a close-up view of a modified source/channel region according to an implementation of the disclosure.

FIG. 1B depicts an example LDMOS transistor 100B of the disclosure in which the NSD region 106 is omitted. The disclosed LDMOS transistor 100B is determined to improve the ruggedness of the baseline LDMOS transistor 100A. The omission of the NSD region 106 from the LDMOS transistor 100B is understood to reduce the counter-doping of the DWELL-B 102, which in turn may reduce triggering of the parasitic NPN BJT. In such implementations the DWELL-As 108 is understood to provide ohmic connection to the silicide, but without the additional conductivity provided by the baseline implementation.

Figure 1C:
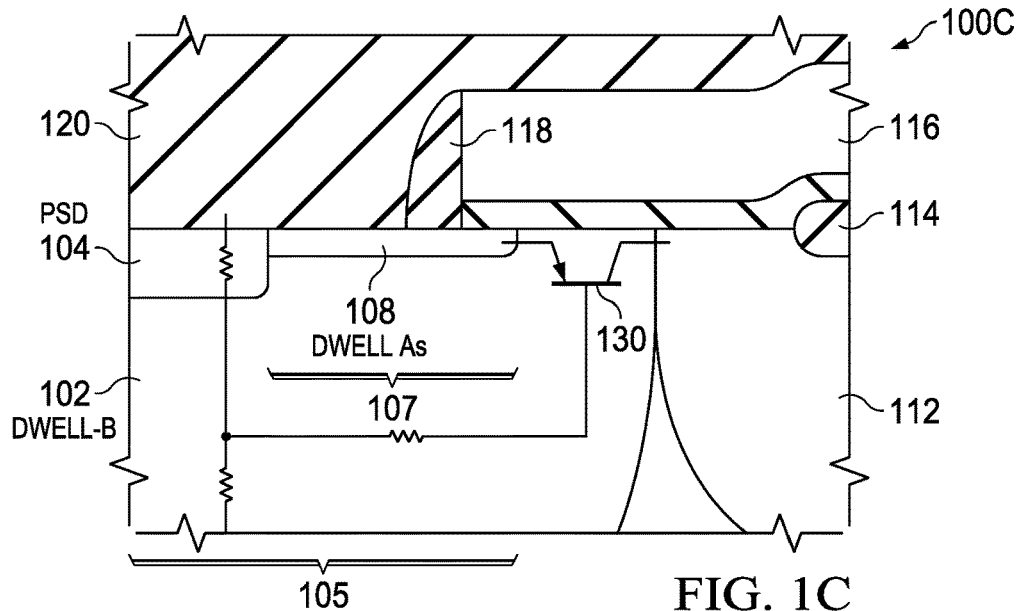
FIG. 1C depicts the source/channel region of FIG. 1B, with a schematic of a parasitic NPN BJT overlaid on the region.

FIG. 1C illustrates the source/IBG region 105 of an LDMOS transistor 100C, again with the NSD region 106 of the baseline implementation of FIG. 1A omitted, demonstrating a parasitic NPN BJT 130. The parasitic NPN BJT 130 includes a base provided by the DWELL-B 102, an emitter provided by the DWELL-As 108, and a collector provided by the drift region 112. When a large voltage difference builds up between the DWELL-B 102 and the source region 107, the parasitic NPN BJT 130 can be turned on and potentially cause destruction of the LDMOS transistor 100C and failure of the surrounding device. Therefore, changes that can minimize a voltage difference between the DWELL-B 102 and the source 107 can help provide desired improvements in avalanche current immunity and hence in ruggedness, or safe operating area (SOA).

The present disclosure aims to increase the breakdown voltage of the NPN without reducing the drain-source saturation breakdown voltage BVdss by increasing contact to the DWELL-B region and/or decreasing the counter-doping of the DWELL-B region by the NSD doping profile.

FIGS. 2A-2E depict top plan views of various doping strategies that may be employed in various implementations. Each figure includes a source/IBG region 205 with adjacent gate structures 217 shown in dotted lines. In each of FIG. 2A-2E, the two gate structures 217 are elongated in parallel and each of the gate structures 217 includes the combination of a polysilicon gate and an adjacent sidewall spacer, which are not separately shown. The source/IBG region 205 extends between the two gate structures 217 and includes a source region 207 associated with each of the gate structures 217 and an integrated back-gate region 208 between the two source regions 207. In the implementations shown, the NSD implant is used to implant dopants into the polysilicon gate that is part of the gate structures 217, as well as into the source/IBG regions 205, and each of FIGS. 2A-2E reflect the doping of the polysilicon gate. Prior to receiving the NSD doping and the PSD doping, the source/IBG region 205 contains the arsenic doping that forms the DWELL-As.

Figures 2A, 2B:
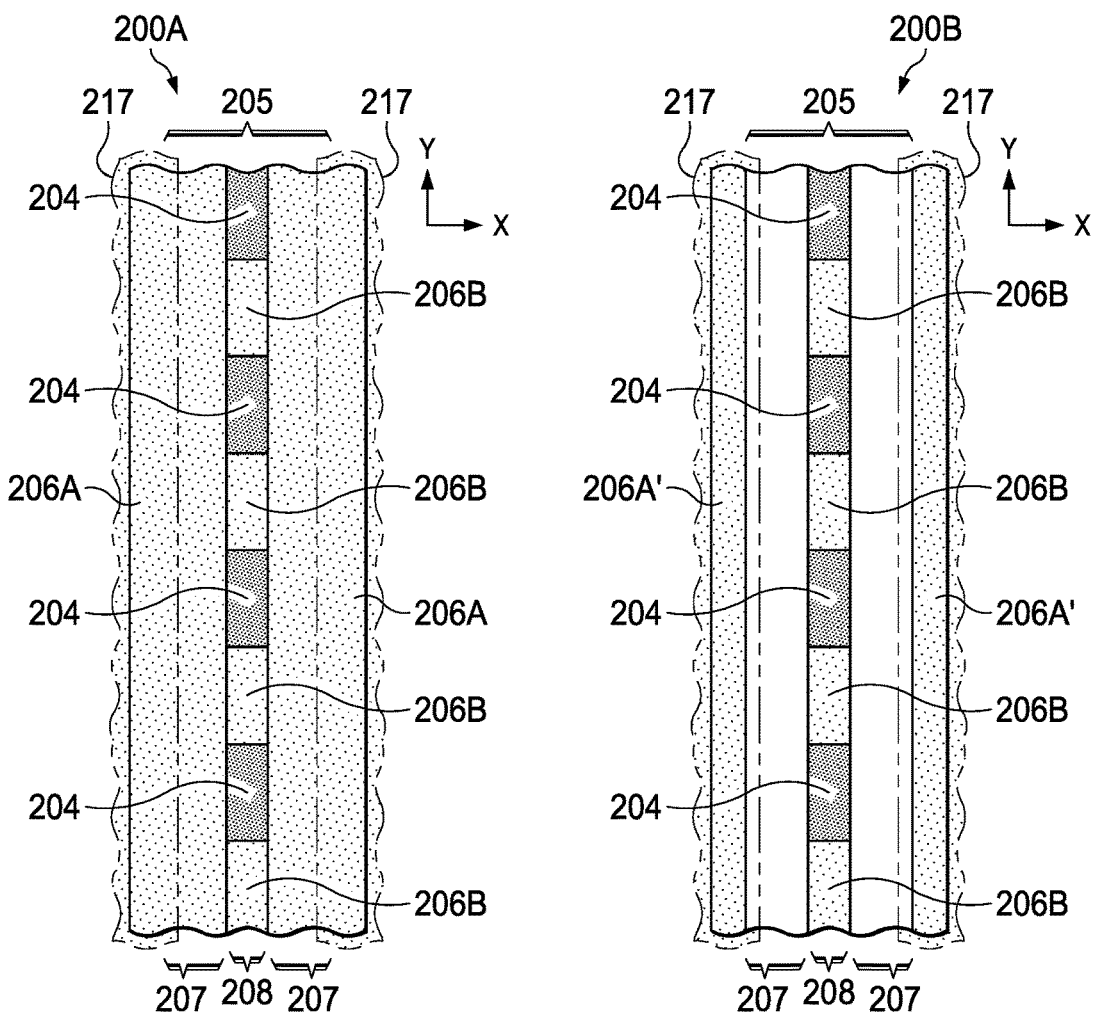
FIG. 2A depicts a top plan view of doping to the gate and the source/IBG region of an LDMOS transistor according to a baseline implementation.
FIG. 2B depicts a top plan view of an alternative doping to the gate and the source/IBG region according to an implementation of the disclosure.

FIG. 2A depicts the gate structures 217, an NSD implant region 206 and a PSD implant region 204 for a baseline LDMOS transistor 200A. Although all areas of the NSD implant region 206 receive the NSD dopants at the same time, different regions of the NSD implant region 206 are labeled with suffixes to better guide discussion of these regions. In the baseline LDMOS transistor 200A, each NSD implant region 206A extends across a respective gate structure 217 and the adjacent source region 207. The NSD implant has a relatively deep phosphorus tail, which is added to reduce source/drain capacitance in N-type metal-oxide-semiconductor (NMOS) transistors being fabricated at the same time. This deep phosphorus tail counter-dopes the DWELL-B 102 (FIG. 1), which increases the parasitic NPN BJT's base resistance, reduces the drain voltage at the point of failure and degrades the LDMOS SOA, which will be discussed below with regard to FIG. 4C. The IBG region 208 includes the PSD implant regions 204 alternating with NSD implant regions 206B. Because the cut line of FIG. 1A is through an NSD implant region (106 in FIG. 1A), the alternating nature of the PSD implant regions 204 and NSD implant regions 206B is not apparent in the view of that figure. The alternating sections of the NSD implant regions 206B and the PSD implant regions 204 within the IBG region 208 can provide contacts to both the source region 207 and to the underlying DWELL-B region 102 (FIG. 1A), which forms the body of the baseline LDMOS transistor 100A. It will be understood that the NSD implant does not penetrate the sidewall spacers that are part of the gate structures 217; the continuous coverage of the NSD implant is made to ensure that all the area of the source region 207 is part of the NSD implant region.

As noted earlier, while the NSD implant region 206A of FIG. 2A provides the desired doping next to the channel region (not specifically shown), the NSD implant region 206A also counter-dopes part of the DWELL-B region 102 (FIG. 1A), increasing the resistance through the DWELL-B region 102 and increasing the possibility of triggering the parasitic NPN BJT 130 (FIG. 1C) during an extreme electrical event. Removing the NSD implantation from the source region of an LDMOS transistor is counter-intuitive because of the consequent increase in the ohmic resistance in the source region, however, the possibility of a viable LDMOS transistor without NSD implant was examined and tested because of the potential benefits that could be provided for ruggedness.

FIG. 2B depicts an LDMOS transistor 200B having the gate structures 217, a much-reduced NSD implant region 206A', while the NSD implant region 206B and the PSD implant region 204 remain the same. The NSD implant region 206A' does not include the source regions 207, although the two source regions 207 will have received the arsenic implant that forms the DWELL-As (not specifically shown in this figure). The NSD implant region 206A' includes the polysilicon portion of the gate structures 217; and the NSD implant region 206B alternates with the PSD implant region 204 within the IBG region 208 for most of the length of the gate structures 217. The LDMOS transistor 200B worked surprisingly well. It appears that once the current is able to make its way into the DWELL-As, e.g., through the NSD implant regions 206B, the current can flow without excessive ohmic voltage loss.

FIG. 2C again depicts an LDMOS transistor 200C containing the gate structures 217 and the source/IBG region 205. The polysilicon gates within the gate structures 217 are the only features shown that are part of the NSD implant region 206A'. Within the IBG region 208, a solid PSD implant region 204' now forms a stripe that extends almost the length of the gate structures 217. The solid PSD implant region 204' provides a strong connection to the underlying DWELL-B region (not specifically shown), which can help maintain the source regions 207 and the DWELL-B region at the same voltage, thus minimizing the chance that the parasitic NPN BJT would be turned on. However, the LDMOS transistor 200C relies entirely on the DWELL-As to make an ohmic connection to the silicide, which depends on the details of the silicide process and the DWELL-As doping profile. The DWELL arsenic doping profile cannot be too heavy, otherwise it could counter-dope the PSD in the IBG region, which would prevent making a firm backgate connection. As a result, the DWELL arsenic doping cannot be as high as the NSD implant, which excels at forming an ohmic connection. Using the doping level of the baseline LDMOS transistor, the series resistance in the source of the LDMOS transistor 200C was considerably higher than the series resistance in the source of the baseline LDMOS transistor 200A or even the LDMOS transistor 200B, so that the LDMOS transistor 200C is unable to work effectively.

Figure 2E:
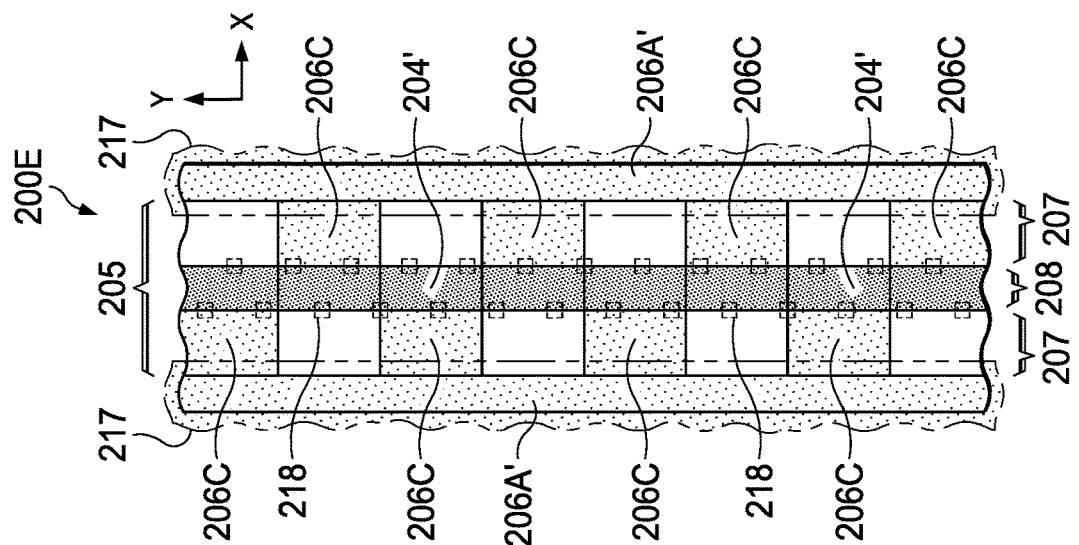
FIGS. 2D-2E depict top plan views of alternative doping to the gate and the source/IBG region according to implementations of the disclosure.
Figure 2D:
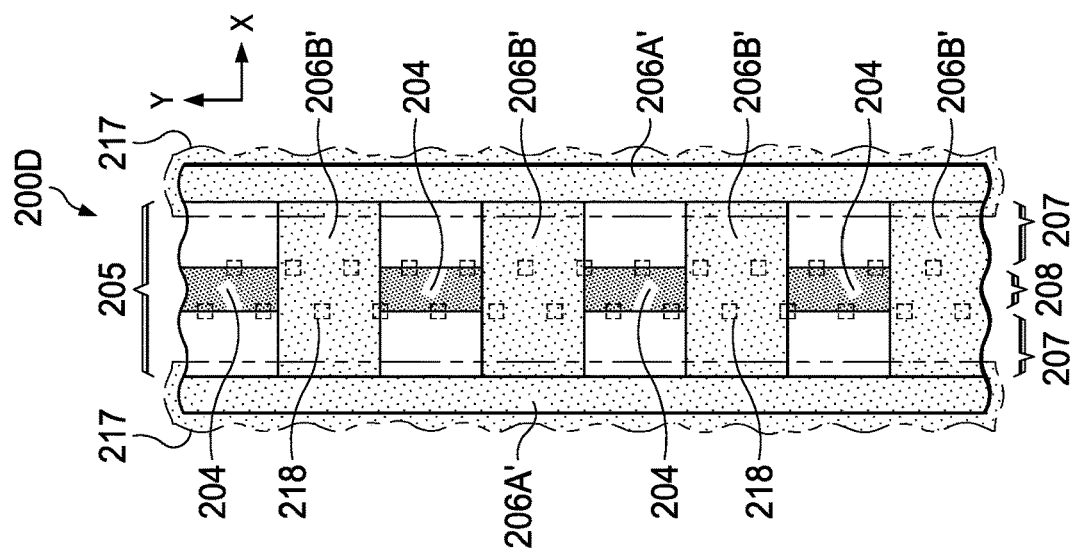
Figure 2C:
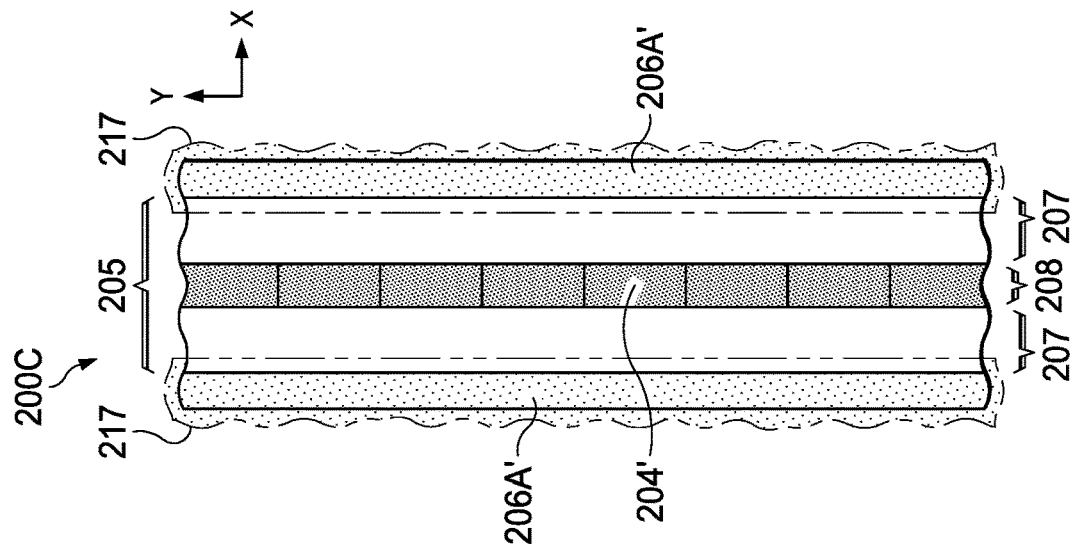
FIG. 2C depicts a top plan view of an alternative doping to the gate and the source/IBG region.

FIG. 2D discloses an LDMOS transistor 200D that combines aspects of the source/IBG regions 205 shown in the LDMOS transistor 200A and the LDMOS transistor 200B. The LDMOS transistor 200D contains NSD dopants in portions of the source regions 207, while other portions of the source regions 207 contain only DWELL-As dopants (not specifically shown). The regions of the source that receive NSD dopants are referred to herein as heavier-doped source sub-regions and may extend between the NSD implant regions 206A' and cross the IBG region 208, while the regions of the source that do not receive NSD dopants are referred to herein as lighter-doped source sub-regions. The LDMOS transistor 200D includes the NSD implant regions 206A' over the polysilicon gates within the gate structures 217 and also includes the NSD implant regions 206B' that extend from a first polysilicon gate in a first gate structure 217 across all of the source/IBG region 205 to a second polysilicon gate in a second, adjacent gate structure 217. It was found that the doping combination in FIG. 2D provides good conduction through the source region 207, because having some NSD implants reduces the overall resistance of the source region 207. The doping combination also decreases the counter-doping of the DWELL-B and lowers the susceptibility to triggering of the inherent parasitic NPN BJT by allowing the parasitic NPN BJT to maintain a lower base resistance, which provides a higher drain voltage at failure and greater avalanche current immunity.

FIG. 2E discloses an LDMOS transistor 200E that combines aspects of the source/IBG regions 205 shown in the LDMOS transistor 200A and the LDMOS transistor 200C. The LDMOS transistor 200E contains the solid PSD implant region 204' in the IBG region 208 and the NSD implant region 206A' over the polysilicon gates within the gate structures 217. Additionally, an NSD implant regions 206C extend from the solid PSD implant region 204' across a respective source region 207 to the NSD implant region 206A' over the polysilicon gate in a corresponding gate structure 217. Other portions of the respective source regions 207 remain free from the NSD implant and contain only DWELL-As dopants (not specifically shown). As shown in FIG. 2E, the NSD implant regions 206C are provided on alternating sides of the solid PSD implant region 204', although it will be understood that other arrangements can also be used.

In addition to illustrating doping regions, FIG. 2D and FIG. 2E also demonstrate a staggered layout for contacts in the source/IBG region 205. Rather than lining the contacts up in a row, as will be shown for the drain contacts in later illustrations, the source/IBG contacts 218 are staggered to overlap the PN junction between the IBG region 208 and both of the source regions 207. Charges can then easily cross the PN junction and maintain a similar voltage level between the source regions 207 and the solid PSD implant region 204'. The staggered source/IBG contacts 218 and the stripe of the solid PSD implant region 204' provide improved connections to the DWELL-B and the channel region (neither are specifically shown), as well as increase the robustness of the LDMOS transistor 200E. Despite early concern about the workability of an LDMOS transistor with reduced NSD implants, the LDMOS transistor 200B, the LDMOS transistor 200D, and the LDMOS transistor 200E show positive results with regard to both operability and improved ruggedness.

Figure 3A:
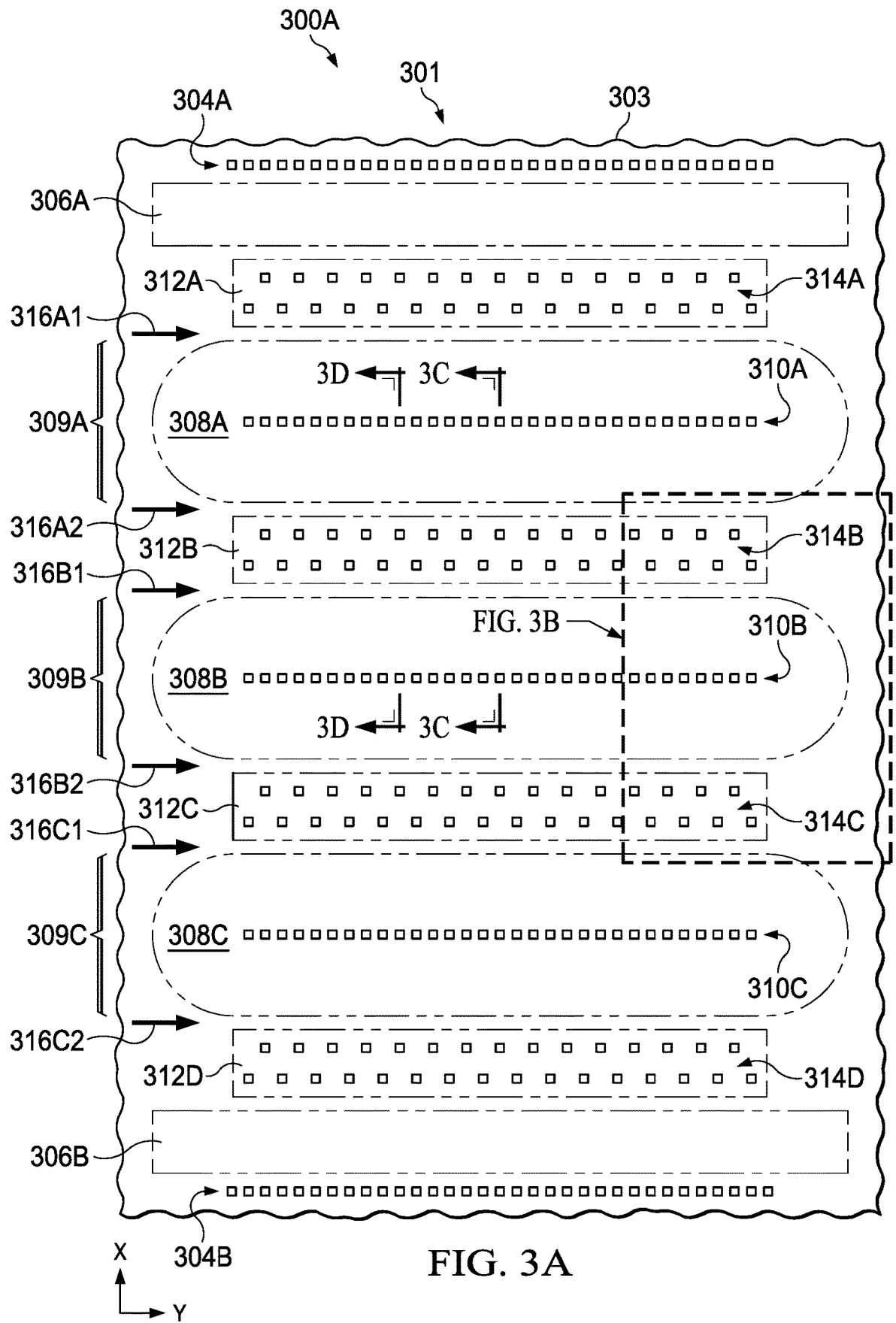
FIG. 3A depicts a partial top plan view at the contact level of an integrated circuit that can contain one or more LDMOS transistors according to an implementation of the disclosure.
Figure 3B:
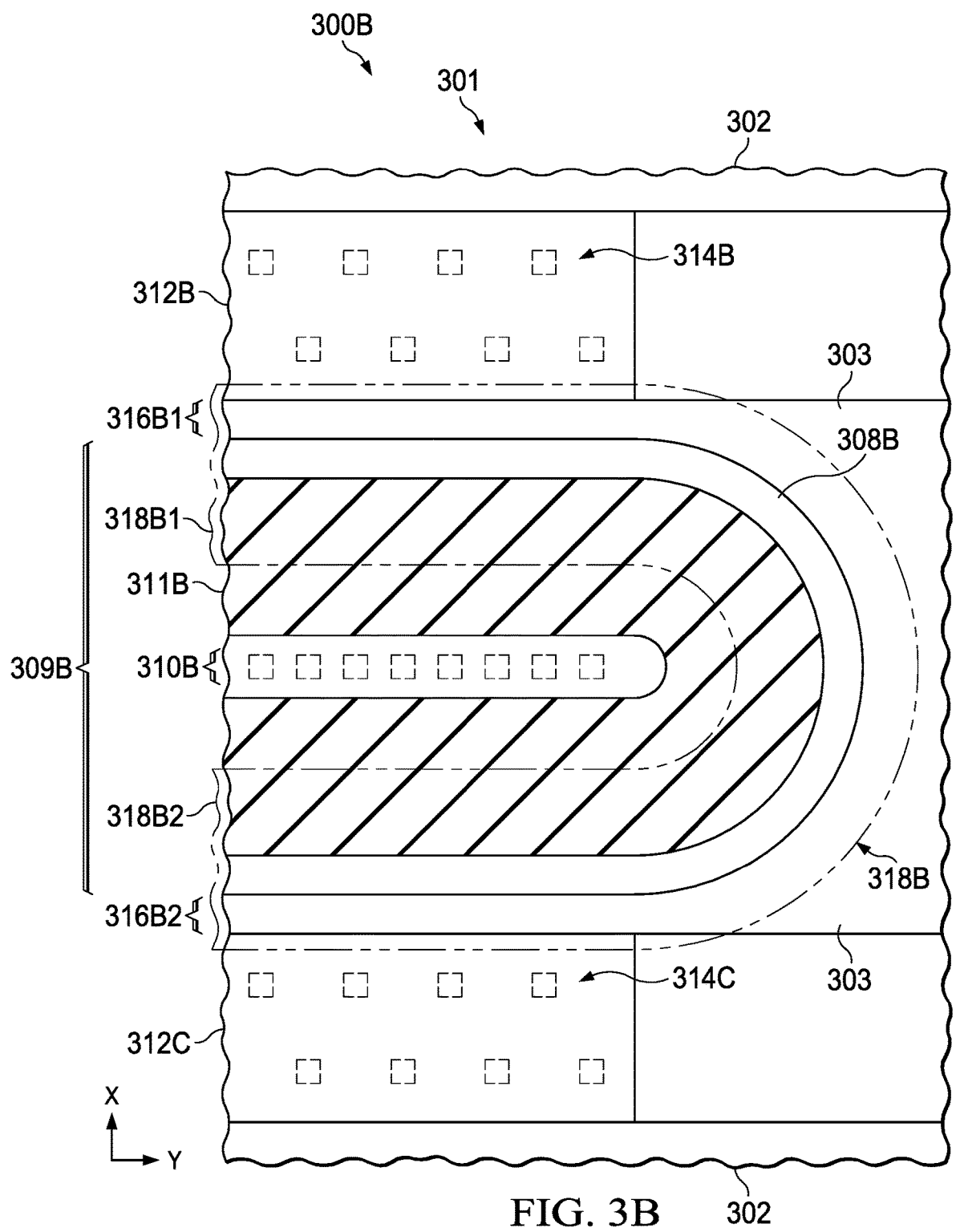
FIG. 3B depicts an enlarged partial top plan view of the integrated circuit of FIG. 3A at the surface of the substrate according to an implementation of the disclosure.
Figure 3C:
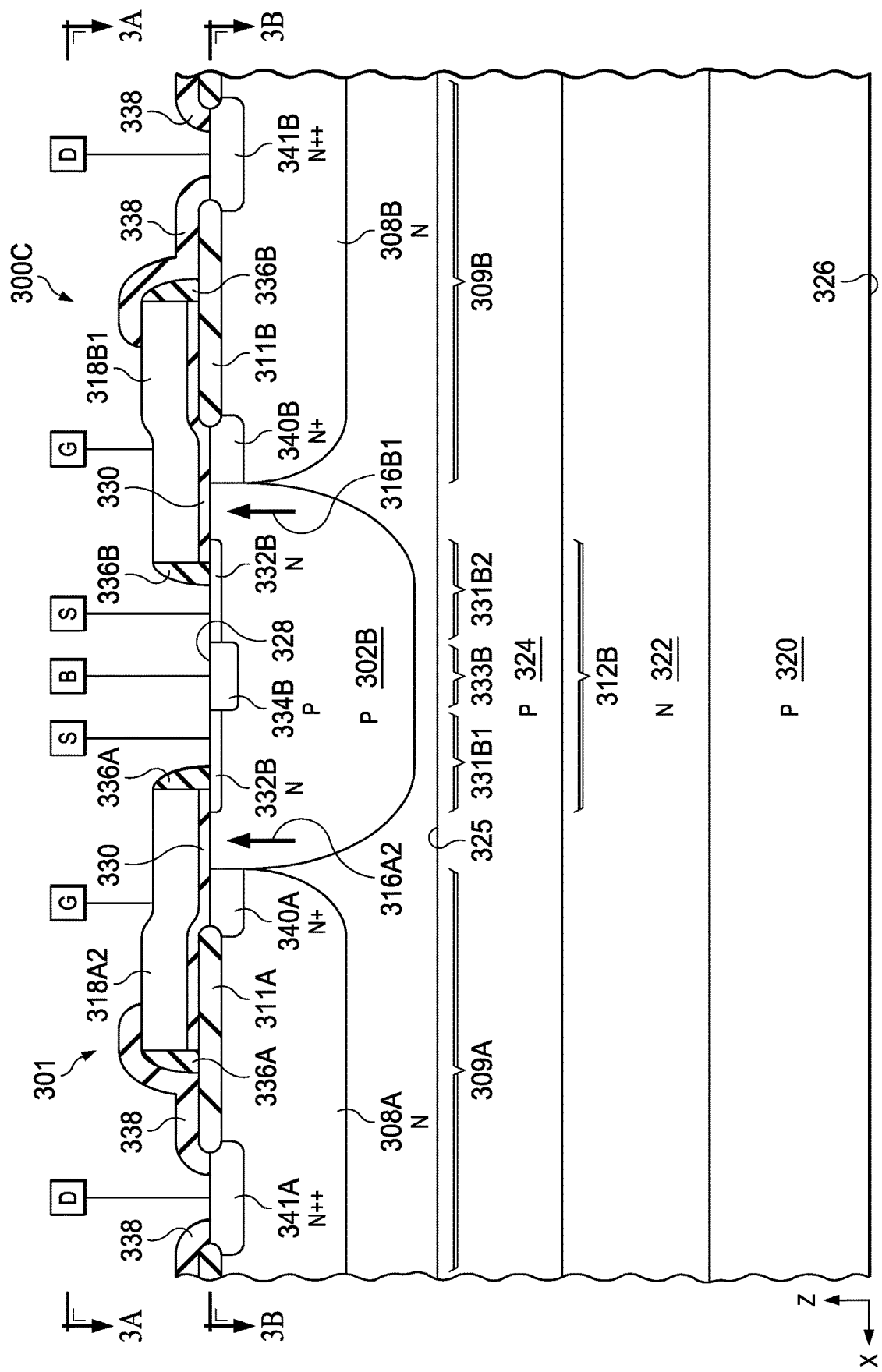
FIG. 3C depicts a partial side elevation view of the integrated circuit of FIG. 3A at a first cross-sectional location according to an implementation of the disclosure.
Figure 3D:
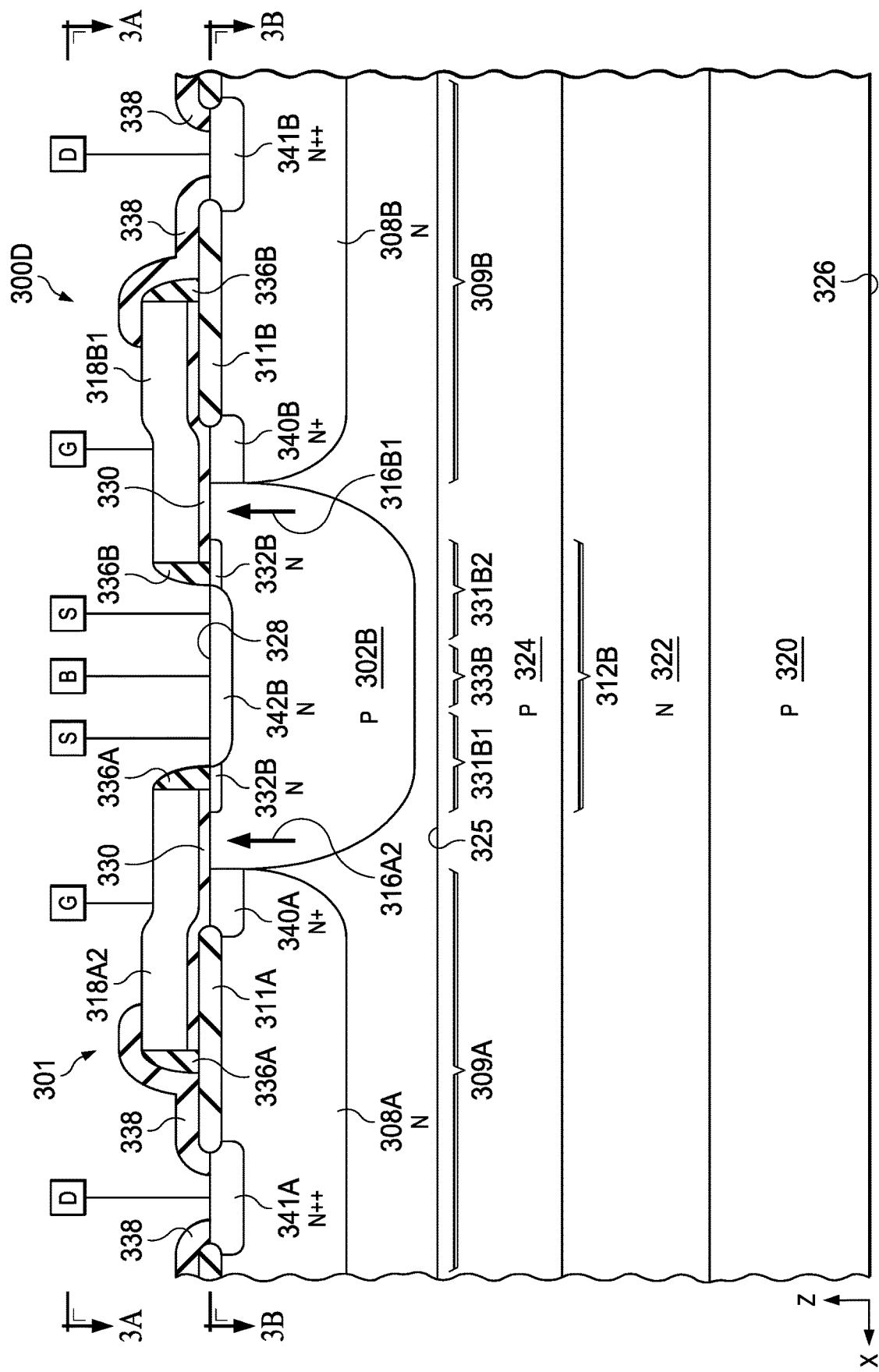
FIG. 3D depicts a partial side elevation view of the integrated circuit of FIG. 3A at a second cross-sectional location according to an implementation of the disclosure.

FIGS. 3A-3D provide several different views of an integrated circuit 301 containing a drain-centered LDMOS transistor 300 according to the disclosure. FIG. 3A depicts a partial top plan view at the contact level to provide an overview of the LDMOS transistor 300. FIG. 3B depicts an enlarged top plan view of a drain region and surrounding structures at the substrate surface to better illustrate the racetrack layout of the drain-centered LDMOS transistors and includes the enclosed region 3B shown in FIG. 3A. In FIG. 3A and FIG. 3B, elements that are either above or below the level of interest are shown by dotted lines. FIG. 3C and FIG. 3D each depict a partial side elevation view of the integrated circuit 301 of FIG. 3A respectively at a first cross-section through line 3C-3C and a second cross-section through line 3D-3D as shown in FIG. 3A. Although the doping levels are not specifically shown in FIG. 3A, FIG. 3C depicts a section of the source/IBG region 312 that includes only a lighter-doped source sub-region 332B, e.g., containing only the dopants from the DWELL-As, and FIG. 3C depicts a section of the source/IBG region 312 that includes both the lighter-doped source sub-region 332B and a heavier-doped source sub-region 342B. Some of the features of FIGS. 3A-3D are described in U.S. Pat. No. 10,461,182, which is owned in common with the present application and which is incorporated by reference herein in its entirety. Although this discussion focuses on a drain-centered layout of an LDMOS transistor, the disclosed improvements are expected to also benefit a source-centered layout style.

In the implementation shown in FIG. 3A, an active region, which lies within a P-body region 303, is surrounded by an isolation structure, which is not specifically shown in order to focus on the active region. In at least one implementation, gate contact structures (not specifically shown) are formed above the surrounding isolation structure and thus are not seen in FIG. 3A. The structures of an LDMOS transistor 300A are elongated along the Y-axis. In one implementation, a first peripheral body contact 304A can be separated from the rest of the active area by a first oxide structure 306A, which can be, for example, a field oxide or shallow trench isolation (STI), and a second peripheral body contact 304B can be separated from the rest of the active area by a second oxide structure 306B. Because the peripheral body contacts 304 can be a distance from channel regions 316, it can be advantageous to have additional contacts to the body region that are nearer to the channel regions 316, which the IBG region can provide through suitable PSD implants (not specifically shown).

Additional structures in the LDMOS transistor 300A include a first drain region 309A that includes a drift region 308A and drain contacts 310A, a second drain region 309B that includes a drift region 308B and drain contacts 310B, and a third drain region 309C that includes drift region 308C and drain contacts 310C. A source/IBG region 312A lies between the first oxide structure 306A and the drift region 308A and contains staggered source/IBG contacts 314A. Similarly, a source/IBG region 312B lies between the drift region 308A and the drift region 308B and contains staggered source/IBG contacts 314B; a source/IBG region 312C lies between the drift region 308B and the drift region 308C and contains staggered source/IBG contacts 314C; and a source/IBG region 312D lies between the drift region 308C and the second oxide structure 306B and contains staggered source/IBG contacts 314D.

Although the gates of the LDMOS transistor 300A are not specifically shown in this figure, channel regions 316 are formed between a respective drain region 309 and a respective source/IBG region 312. As shown, a channel region 316A1 lies between the source/IBG region 312A and the drain region 309A; a channel region 316A2 lies between the drain region 309A and the source/IBG region 312B; a channel region 316B1 lies between the source/IBG region 312B and the drain region 309B; a channel region 316B2 lies between the drain region 309B and the source/IBG region 312C; a channel region 316C1 lies between the source/IBG region 312C and the drain region 309C; and a channel region 316C2 lies between the drain region 309C and the source/IBG region 312D.

FIG. 3B depicts an enlargement of the marked portion of the drain region 309B and the structures around the drain region 309B of LDMOS transistor 300B. While FIG. 3A illustrated the connection level, with several structures on lower levels shown in dotted lines for context, FIG. 3B depicts regions at the level of the surface of the substrate, with several overlying structures shown in dotted lines for context. Within the drain region 309B, the drift region 308B forms a closed loop with a field relief oxide 311B formed over a portion of the drift region 308B and also following the closed loop; the field relief oxide 311B may be formed, for example, using a localized oxidation of silicon (LOCOS). The drain contacts 310B are aligned in a row within the drain region 309B that is enclosed by the field relief oxide 311B.

The source/IBG region 312B lies within a first double diffused well (not specifically shown) that extends generally parallel to the straight section of the drain region 309B and is separated from a first side of the drain region 309B by a region of the first double diffused well that forms a first channel (not specifically shown). The source/IBG region 312C lies within a second double diffused well (not specifically shown) that extends generally parallel to the straight section of the drain region 309B and is separated from a second side of the drain region 309B by a region of the second double diffused well that forms a second channel (not specifically shown), the second direction being opposite to the first direction. The source/IBG contacts 314B and the source/IBG contacts 314C are shown by dotted lines above the source/IBG region 312B and the source/IBG region 312C respectively. Also shown by dotted lines are a polysilicon gate 318B1, which lies over the channel region 316B1 and a polysilicon gate 318B2, which lies over the channel region 316B2. The view of the LDMOS transistor 300B shows that the polysilicon gate 318B1 and the polysilicon gate 318B2 are joined at respective ends to form a single polysilicon gate 318B that also follows the closed loop. Each of the polysilicon gate 318B1 and the polysilicon gate 318B2 also lies over a respective side of the drift region 308B and of the field relief oxide 311B. In an alternate implementation, the LDMOS transistor 300 can be a source-centered LDMOS transistor (not specifically shown), which differs from the LDMOS transistor 300B in that the ends of the polysilicon gates 318 close respective closed loops around the adjacent source/IBG region 312, rather than around the adjacent drain region 309.

Although the doping of the regions of silicon are not specifically shown in FIG. 3B, the source/IBG regions 312 can receive the doping patterns shown in FIG. 2B, FIG. 2D or FIG. 2E or other similar pattern. Additionally, LDMOS transistors may be implemented in arrays, which may contain a large number of the LDMOS transistors that are switched together. The different layouts provided herein, e.g., from FIG. 2A, FIG. 2B, FIG. 2D, and FIG. 2E, generally provide different properties that affect the operation of the respective transistors. When LDMOS transistors within the array are designed with different NSD/PSD doping in the source/IBG region, the LDMOS transistors can be switched in a manner that takes advantage of these differing properties, e.g., to control turn-on timing during switching. The LDMOS transistor 300B can also be implemented as a single-finger LDMOS, with only one drain stripe, e.g., the drain region 309B lying between a first source/IBG region and a second source/IBG region, e.g., the source/IBG region 312B and the source/IBG region 312C.

FIG. 3C depicts a partial side elevation view of the LDMOS transistor 300A taken along a line 3C-3C of FIG. 3A between the drain contacts 310A and the drain contacts 310B. Although the LDMOS transistor 300A is drain centric, FIG. 3C and FIG. 3D are centered on the source/IBG region 312B, which lies between two gates, e.g., the polysilicon gate 318A2 and the polysilicon gate 318B1. One skilled in the art will be able to modify the layout shown in an appropriate manner when one side of the source/IBG region 312 abuts a feature other than a polysilicon gate, e.g., the oxide structure 306A or the oxide structure 306B. The implementations shown in FIG. 3C and FIG. 3D illustrate the LDMOS transistor 300 that is using the dopant patterning that is shown in FIG. 2D, although the dopant patterning that is shown in FIG. 2E can also be used and will be shown during discussion of the fabrication of an integrated circuit including the disclosed LDMOS transistors.

The illustrated cross-section of the LDMOS transistor 300C is an N-channel LDMOS transistor. Other implementations are possible within the scope of the present disclosure, including p-channel drain extended transistor examples (e.g., p-channel LDMOS) using oppositely doped structures and regions. In one example, a semiconductor substrate 320 is a p-doped silicon substrate or wafer, with a first surface 328 (e.g., containing the active regions), a buried layer 322 and a buried layer 324 formed therein, and a second surface 326 opposite the first surface 328. In another possible implementation, the semiconductor substrate 320 includes one or more epitaxial silicon layers (not shown) formed on a top surface, with one or more of the buried layers 322 and the buried layer 324 in epitaxial layers of the substrate. In the implementation shown, the buried layer 322 is implanted with N-type dopants, e.g., phosphorus, etc. and the buried layer 324 is implanted with P-type dopants, e.g., boron, etc.

The LDMOS transistor 300C includes a diffused well having P-type majority carrier dopants, which in one implementation are boron, forming a DWELL-B 302B. The DWELL-B 302B includes a first channel region 316A2 and a second channel region 316B1 that extends to the first surface 328 of the semiconductor substrate 320. The LDMOS transistor 300C also includes the source/IBG region 312B that extends along the first surface 328, in the direction of the X-axis, from the first channel region 316A2 to the second channel region 316B1 and includes a first source region 331B1, a second source region 331B2, and an IBG region 333B between the first source region 331B1 and the second source region 331B2. In the cross-section shown in FIG. 3C, the first source region 331B1 includes a lighter-doped source sub-region 332B adjacent the first channel region 316A2; the second source region 331B2 includes a lighter-doped source sub-region 332B adjacent the second channel region 316B1; and the IBG region 333B contains an IBG sub-region 334B. In one implementation, the concentration of N-type dopants in the first source region 331B1 and the second source region 331B2 is less than about $10^{20}$ atoms/cm$^3$ and may be about $2 \times 10^{19}$ atoms/cm$^3$. In one implementation, the junction depth in the first source region 331B1 and the second source region 331B2 is less than about 1.0 micron and may be about 0.08 micron.

The LDMOS transistor 300C also contains the first drain region 309A that is adjacent to a first side of the DWELL-B 302B and the second drain region 309B that is adjacent to a second side of the DWELL-B 302B. The first drain region 309A includes the drift region 308A and the field relief oxide 311A, which extends along the first surface 328 of the semiconductor substrate 320 to provide a field gap for a laterally diffused extended drain. The field relief oxide 311A extends between a first drift contact region 340A that is adjacent the first channel region 316A2 and a first drain contact region 341A. The drift region 308A includes N-type majority carrier dopants, in which the first drift contact region 340A may have an N+ doping and the first drain contact region 341A may have an N++ doping. In the implementation shown in FIG. 3C and FIG. 3D, the field relief oxide 311A is a LOCOS structure.

Similarly, the second drain region 309B includes the drift region 308B and the field relief oxide 311B, which extends along the first surface 328 of the semiconductor substrate 320 to provide a field gap. The field relief oxide 311B extends between a second drift contact region 340B that is adjacent the second channel region 316B1 and a second drain contact region 341B. The drift region 308B includes N-type majority carrier dopants, in which the second drift contact region 340B may have an N+ doping and the second drain contact region 341B may have an N++ doping. Again, the field relief oxide 311B is a LOCOS structure.

A first polysilicon gate 318A2 extends at least partially over the channel region 316A2 of the DWELL-B 302B and a second polysilicon gate 318B1 extends at least partially over the channel region 316B1 of the DWELL-B 302B. A gate dielectric layer 330 is formed over the first surface 328 of the semiconductor substrate 320 and the first polysilicon gate 318A2 and the second polysilicon gate 318B1 are formed on the gate dielectric layer 330; first sidewall spacers 336A are formed along lateral sides of the first polysilicon gate 318A2 and second sidewall spacers 336B are formed along lateral sides of the second polysilicon gate 318B1.

A protection layer 338 is shown, portions of which extend on the field relief oxide 311A between the first sidewall spacer 336A and the first drain contact region 341A and also extend on the field relief oxide 311B between the second sidewall spacer 336B and the second drain contact region 341B. In one implementation, the protection layer 338 can include an oxide material, a nitride material, or an oxynitride material. The protection layer 338 in one implementation is a silicide block material that mitigates or prevents silicidation of the field relief oxide 311A and the field relief oxide 311B during and after formation of silicide contacts (not specifically shown). The protection layer 338 in this example can be used to concurrently protect the field relief oxide 311A and the field relief oxide 311B and to provide control of silicide formation in other components of the integrated circuit 301. In this example, no additional masks or processing steps are needed to provide the protection layer 338 in the LDMOS transistor 300C during fabrication.

FIG. 3D is a second cross-section the LDMOS transistor 300C, taken along a line 3D-3D in FIG. 3A and includes the same elements as FIG. 3C, except in the source/IBG region 312B. In FIG. 3D, the portion of source/IBG region 312B shown does not receive the PSD implant, but does receive the NSD implant across the entire region between the first sidewall spacers 336A and the second sidewall spacers 336B to form a heavier-doped source sub-region 342B. Portions of the lighter-doped source sub-region 332B are also seen under the sidewall spacers 336. In one implementation, the heavier-doped source sub-region 342B has a concentration of N-type dopants that is about $2\text{-}3 \times 10^{20}$ atoms/cm$^3$. In one implementation, the doping of the heavier-doped source sub-regions 342B is about ten times heavier than the doping of the lighter-doped source sub-regions. The junction depth in the heavier-doped source sub-region 342B is greater than about 0.1 microns and may be, e.g., about 1.4 microns.

One method of testing ruggedness in an LDMOS transistor is to perform transmission line pulse (TLP) testing on the chip at various gate voltages. In TLP testing, the gate is held at a fixed value while the drain is subjected to TLP pulses at increasing intensities. The testing continues until the LDMOS fails. It is desirable for the drain voltage to be high even for gate voltages (Vg) greater than zero.

Figure 4B:
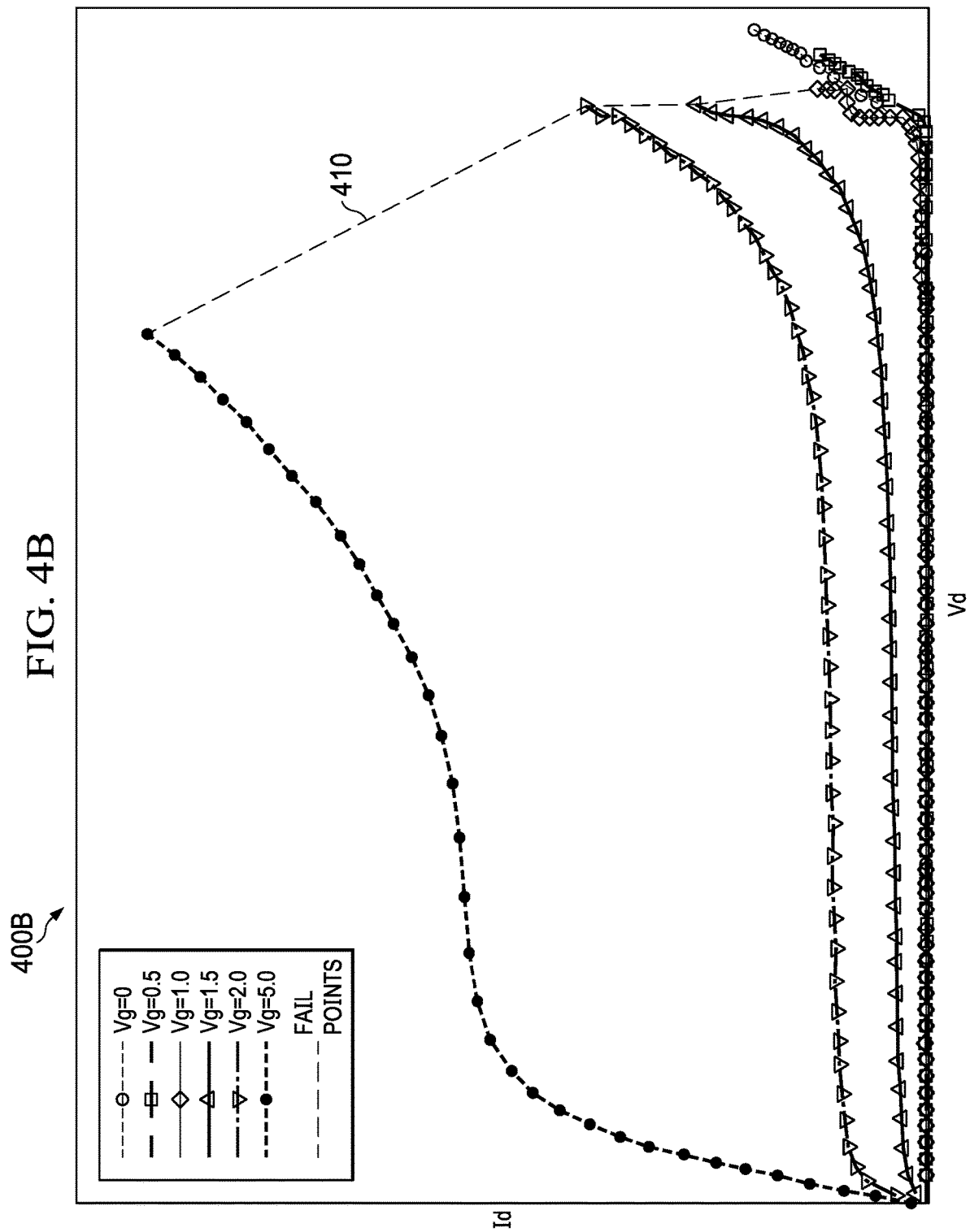
FIG. 4B provides results of TLP testing for an LDMOS transistor according to an implementation of the disclosure.

FIG. 4A contains graph 400A, which depicts the results of TLP testing on a 20 V LDMOS transistor having the baseline NSD/PSD doping shown in FIG. 2A, while graph 400B of FIG. 4B depicts the results of the same procedure on a 20 V LDMOS transistor having the reduced NSD implant in the source/IBG region. In both graph 400A and graph 400B, the X-axis depicts the drain voltage Vd during the TLP pulses, while the Y-axis depicts the drain current Id. The LDMOS transistors were tested at six different gate voltages, e.g., 0 V, 0.5 V, 1.0 V, 1.5 V, 2.0 V, and 5.0 V. A dotted line connects the failure points for each gate voltage.

In FIG. 4A with the baseline doping, all gate voltages of 1.0 V or less showed a drain current Id of zero at low drain voltages Vd, but when the drain voltage approached breakdown, the drain current rose at a steep angle. As the gate voltage is increased in successive tests, failure of the LDMOS transistor occurs at lower drain voltages Vd, but at higher drain currents Id, creating a first failure point line 405 that slopes fairly sharply to the left as the gate voltage Vg increases.

In FIG. 4B using the modified source/IBG region doping, gate voltages of 1.0 V or less exhibited zero drain current until the drain voltage reached about the same voltage as in the baseline LDMOS transistor, at which point the drain current again rose at a steep angle. As the gate voltage increases in successive tests, failure of the LDMOS transistor again demonstrates a pattern of failure at lower drain voltages Vd, but at higher drain currents Id, creating a second failure point line 410 that again slopes to the left as the gate voltage Vg increases, although not as sharply as previously, i.e., using the modified source/IBG region, the LDMOS transistor failed at higher drain voltage and higher drain currents than the LDMOS transistor using the baseline layout.

Figure 4C:
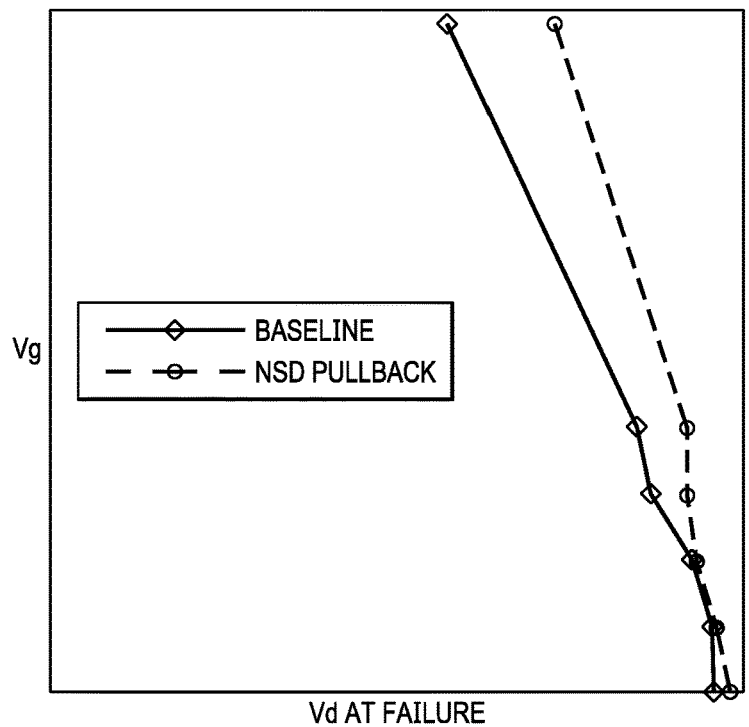
FIG. 4C provides SOA plots derived from FIGS. 4A and 4B together for comparison.

FIG. 4C contains a graph 400C that depicts only the endpoints of the LDMOS testing shown in FIG. 4A and FIG. 4B, although in graph 400C the X-axis depicts the drain voltage Vd at which the chip failed, while the Y-axis depicts the gate voltage Vg used for each specific test. Together, these endpoints plot an outer boundary of a safe operating area (SOA) for a respective LDMOS transistor. As shown in graph 400C, at gate voltages up to about 1.0 V, both transistors exhibit similar values. However, as higher gate voltages are used, the drain voltages at failure of the reduced NSD LDMOS transistor provide more favorable results, which may increase the longevity of the LDMOS transistor.

Figure 4D:
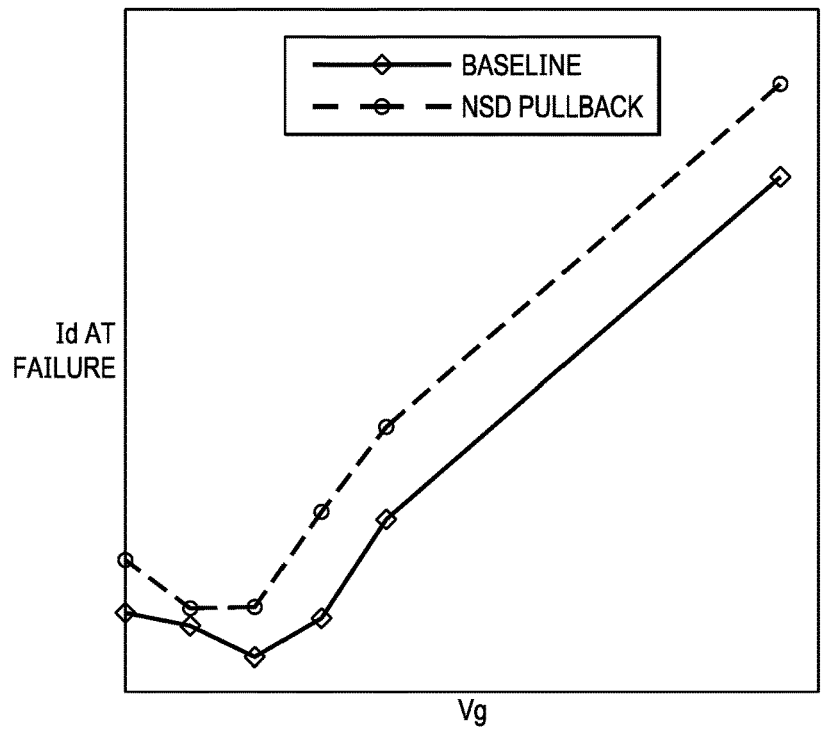
FIG. 4D provides the avalanche plots for a baseline LDMOS transistor and for an LDMOS transistor according to an implementation of the disclosure.

FIG. 4D contains graph 400D that depicts an avalanche plot for both the baseline transistor and the reduced NSD transistor. The X-axis in graph 400D provides the gate voltage for each test and the Y-axis depicts the drain current Id at the point of failure. As seen in FIG. 4D, for each tested voltage, the reduced NSD transistor implementation managed greater current density before reaching failure, demonstrating an improved ability to avoid triggering the NPN BJT. As mentioned previously, these beneficial results are surprising in that they go against long-standing processes that use uniformly high levels of doping throughout the source region of LDMOS transistors to ensure desired conductivity. As disclosed herein, when portions of the source N-type region contain N-type doping that is heavy enough to form a low-resistance ohmic connection to the silicide, other portions of the source N-type region having lower levels of n-type doping such that the lower levels are not guaranteed to form an ohmic connection to the silicide may be present. The more heavily doped portions of the source N-type region should be widespread enough throughout the source region that none of the less heavily doped regions is more than 1 μm from the nearest heavily doped region to facilitate returning source current to the silicide ohmic contact.

Figure 5A:
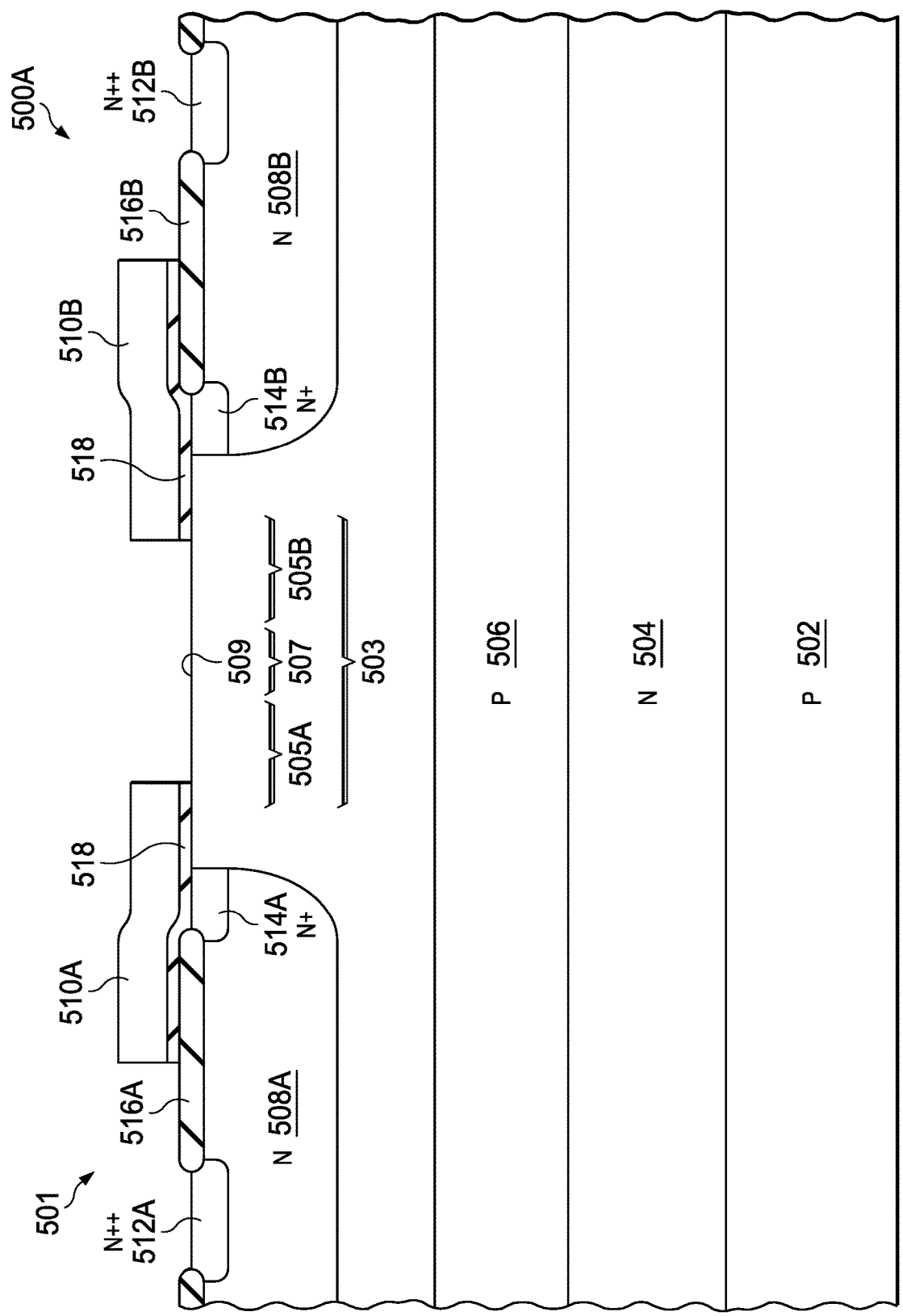
FIGS. 5A-5H depict partial sectional side elevation views of an integrated circuit containing an LDMOS transistor at different stages of fabrication.

FIGS. 5A-5H depict an integrated circuit 500 containing an LDMOS transistor 501 at different stages of fabrication, with a focus on source/IBG region 503 and the surrounding area according to an implementation of the disclosure. FIG. 5A depicts a starting point for the fabrication of the source/IBG region 503 in one implementation of an integrated circuit 500A that contains an LDMOS transistor according to an embodiment of the disclosure. At this starting point, IC 500A includes a semiconductor substrate 502, which has a first conductivity type. The semiconductor substrate 502 may be a silicon substrate in one implementation. The substrate may also be of another material, such as silicon on insulator. A first buried layer 504 has a second conductivity type and a second buried layer 506 has the first conductivity type. In the implementation shown in FIGS. 5A-5H, the transistor is an N-type LDMOS transistor, the first conductivity type is P-type and the second conductivity type is N-type, although a P-type LDMOS transistor can also be made using oppositely doped regions.

A first drift region 508A and a second drift region 508B have been formed in the semiconductor substrate 502 adjacent an upper surface 509; the first drift region 508A and the second drift region 508B have the second conductivity type. A first polysilicon gate 510A has been formed partially over the first drift region 508A; a second polysilicon gate 510B has also been formed partially over the second drift region 508B. In one implementation, an un-doped polysilicon is used to form the first polysilicon gate 510A and the second polysilicon gate 510B. In addition, the first drift region 508A contains a first drain contact region 512A, a first drift contact region 514A, and a first field relief oxide 516A that extends between the first drift contact region 514A and the first drain contact region 512A; and the second drift region 508B contains a second drain contact region 512B, a second drift contact region 514B, and a second field relief oxide 516B that extends between the second drift contact region 514B and the second drain contact region 512B. The first polysilicon gate 510A and the second polysilicon gate 510B are each positioned on a respective gate oxide 518. The source/IBG region 503 includes a first source region 505A adjacent the first polysilicon gate 510A, a second source region 505B adjacent the second polysilicon gate 510B, and an IBG region 507.

Figure 5B:
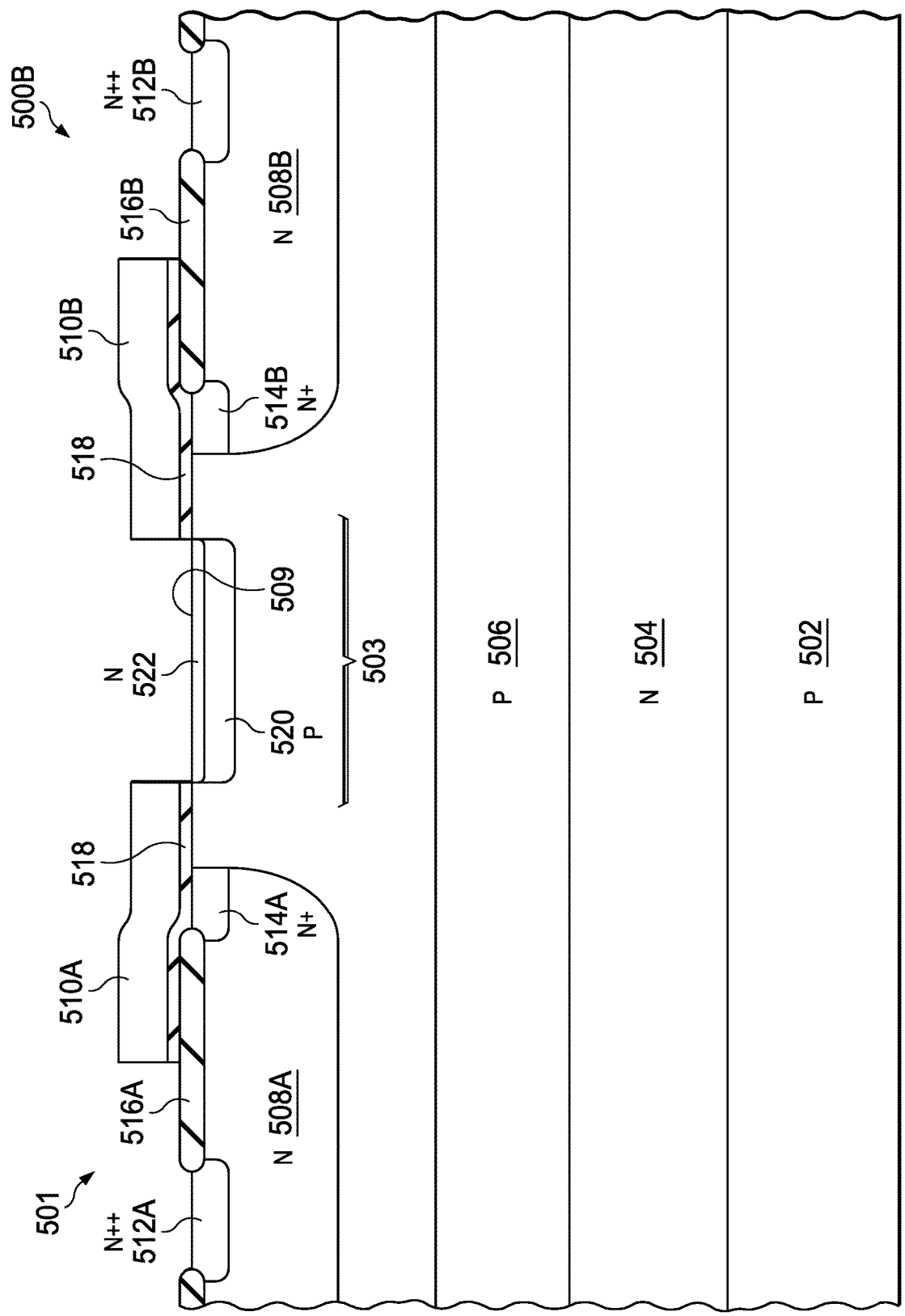

FIG. 5B depicts an IC 500B during formation of the two diffused wells that will contain the source/IBG region 503. A first mask (not specifically shown) was formed that exposed the region between the first polysilicon gate 510A and the second polysilicon gate 510B. In one implementation, the edges of the first polysilicon gate 510A and the second polysilicon gate 510B that are closest to source/IBG region 503 form part of the mask to ensure that all of the source/IBG region 503 will be exposed. Dopants of both the first conductivity type and the second conductivity type are implanted through the first mask to form a first implanted well 520 having the first conductivity type and a second implanted well 522 having the second conductivity type. In one implementation, boron or indium may be used as the dopants of the first conductivity type and arsenic or antimony may be used as the dopants of the second conductivity type that are implanted through the first mask. In one implementation using boron and arsenic, the boron implant for the DWELL-B can use a dose of $8 \times 10^{13}$ to $3.0 \times 10^{14}$ cm$^2$ (e.g., $1.5 \times 10^{14}$ cm$^2$) and an energy of 20 keV to 40 keV. An arsenic implant for the DWELL-As can use a dose $5 \times 10^{13}$ cm$^2$ to $4.0 \times 10^{15}$ cm$^2$ (e.g., $8 \times 10^{14}$ cm$^2$) and an energy of 10 to 40 keV (e.g., 15 keV).

Figure 5C:
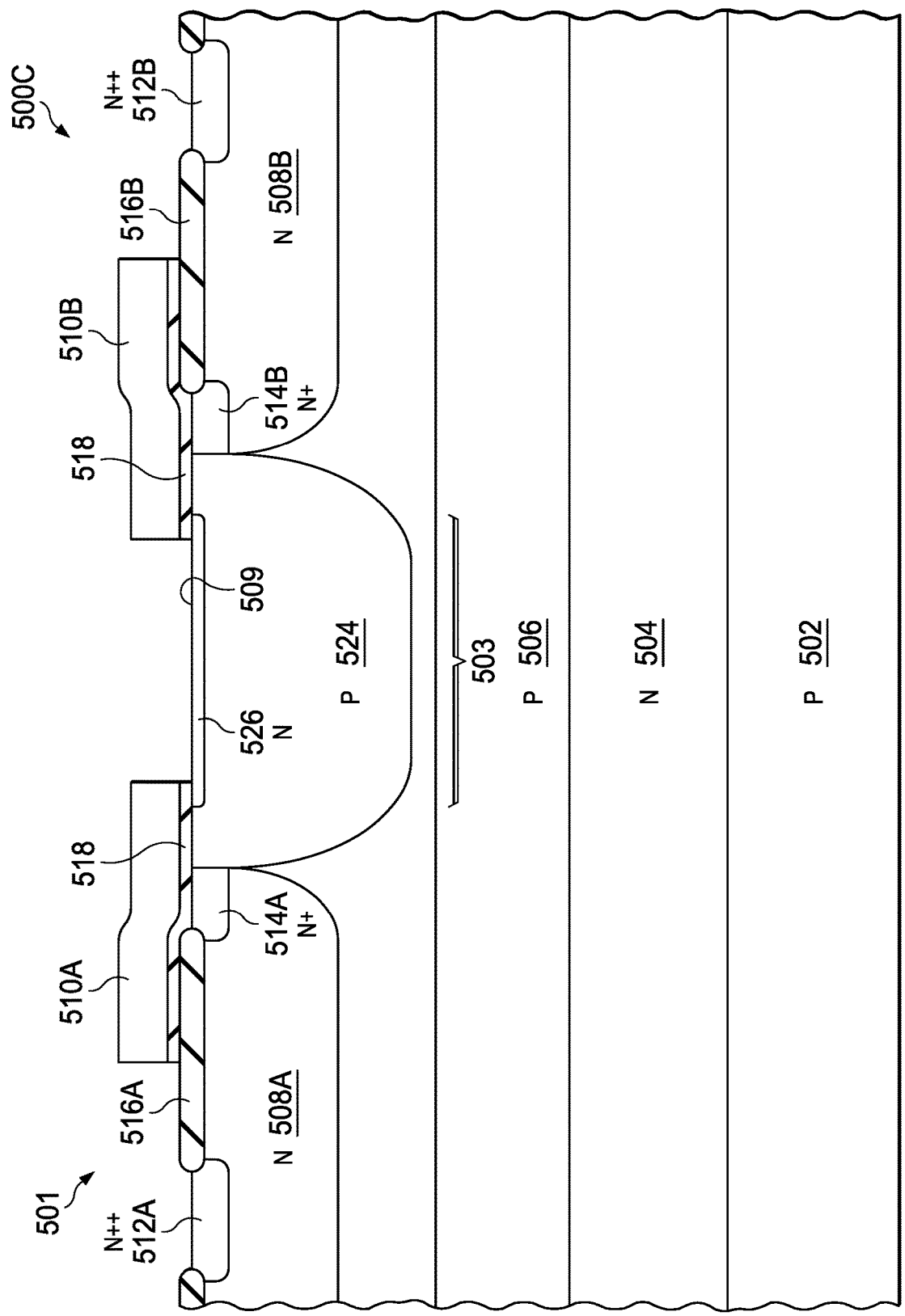

FIG. 5C depicts the IC 500C after the first implanted well 520 and the second implanted well 522 have been annealed to form a first DWELL 524 having the first conductivity type, e.g., P-type, and a second DWELL 526 having the second conductivity type, e.g., N-type. A layer of a dielectric is then deposited over the upper surface 509 of the semiconductor substrate 502 and etched back to provide first sidewall spacers 528A on the first polysilicon gate 510A and second sidewall spacers 528B on the second polysilicon gate 510B as shown in IC 500D of FIG. 5D. While the implants to form the first DWELL 524 and the second DWELL 526 were aligned to the first polysilicon gate 510A and the second polysilicon gate 510B, implants of source/drain dopants of the second conductivity type, e.g., NSD dopants, will be aligned to the sidewall spacers 528.

Figure 5D:
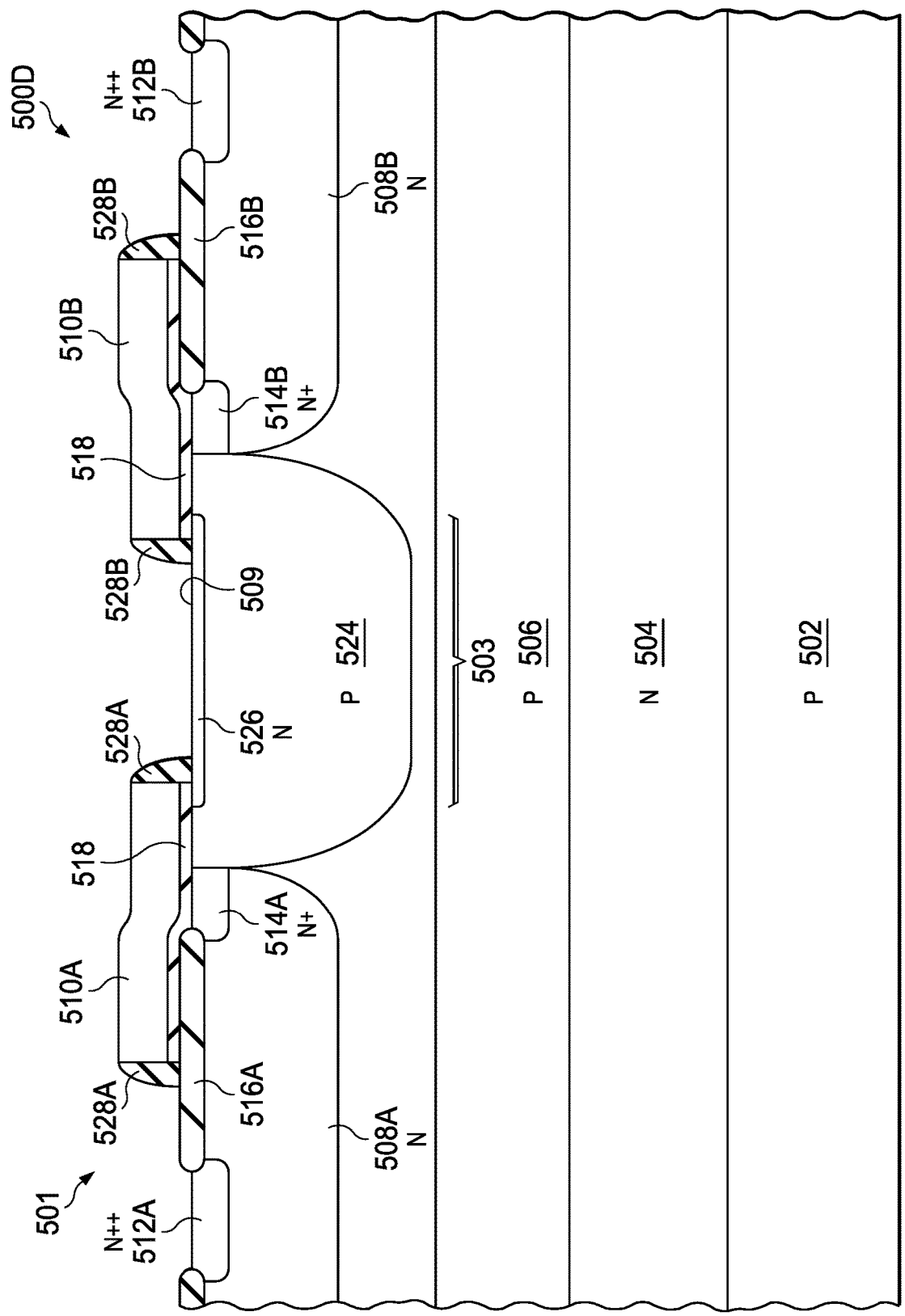
Figure 5E:
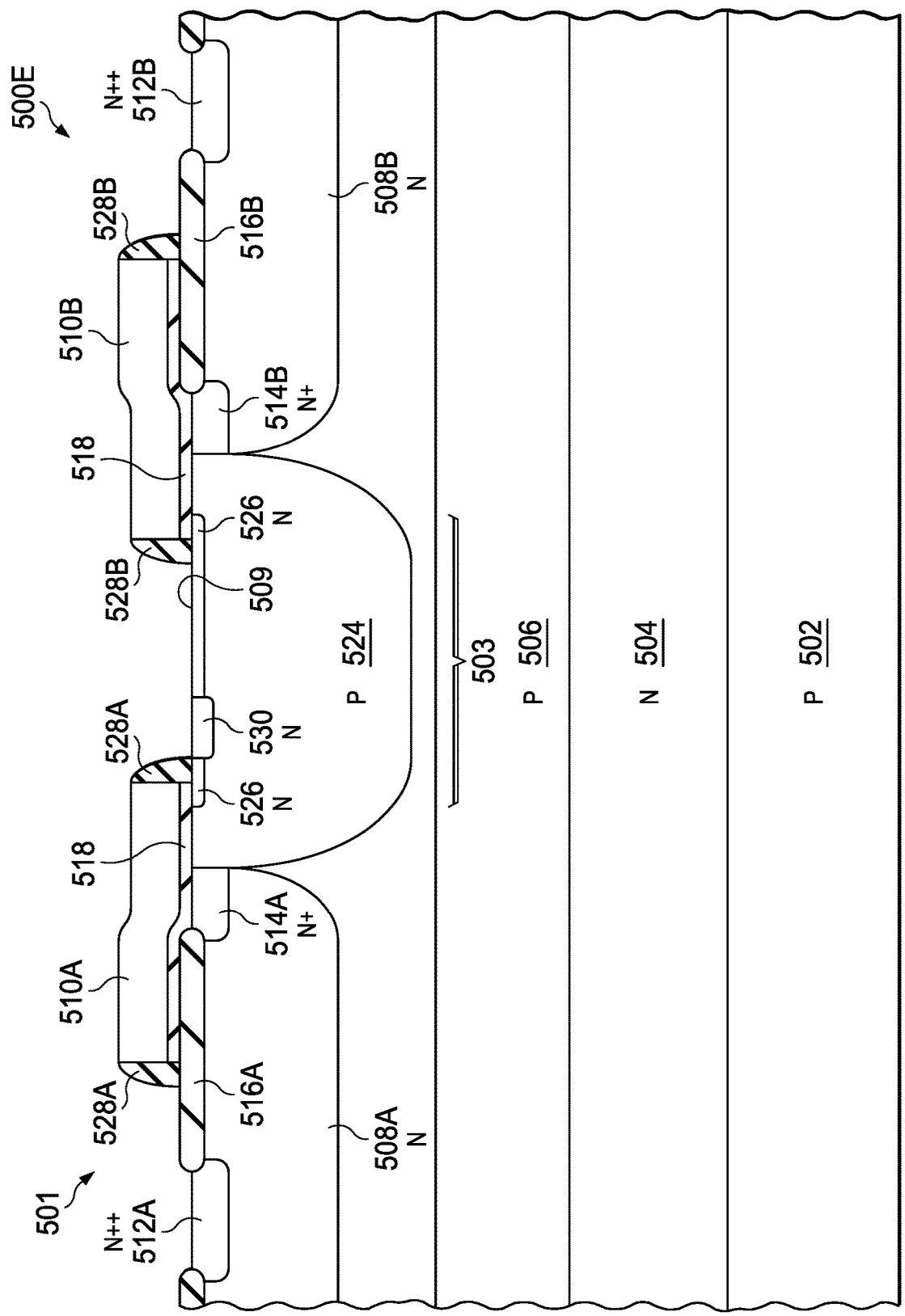

FIG. 5E depicts an IC 500E that has resulted from implanting source/drain dopants of the second conductivity type, e.g., NSD, into selected regions of the source/IBG region 503 according to an implementation of the disclosure. In one implementation, the NSD implant has at least one shallow N-type implant, using any of phosphorus (P), arsenic, or antimony (Sb) with a total dose of at least $1.0 \times 10^{15}$ and an implant range of at most 1000 Å. A second mask (not specifically shown) is formed on the upper surface 509 of the semiconductor substrate 502, with openings to intended heavier-doped source sub-regions 530 of the source/IBG region 503. The implementation shown uses the pattern of FIG. 2E in which NSD is implanted to form heavier-doped source sub-regions 530 that are located on alternating sides of a planned continuous central stripe of PSD dopants. The IC 500E includes an example of a heavier-doped source sub-region 530 that has received the NSD implant.

Figure 5F:
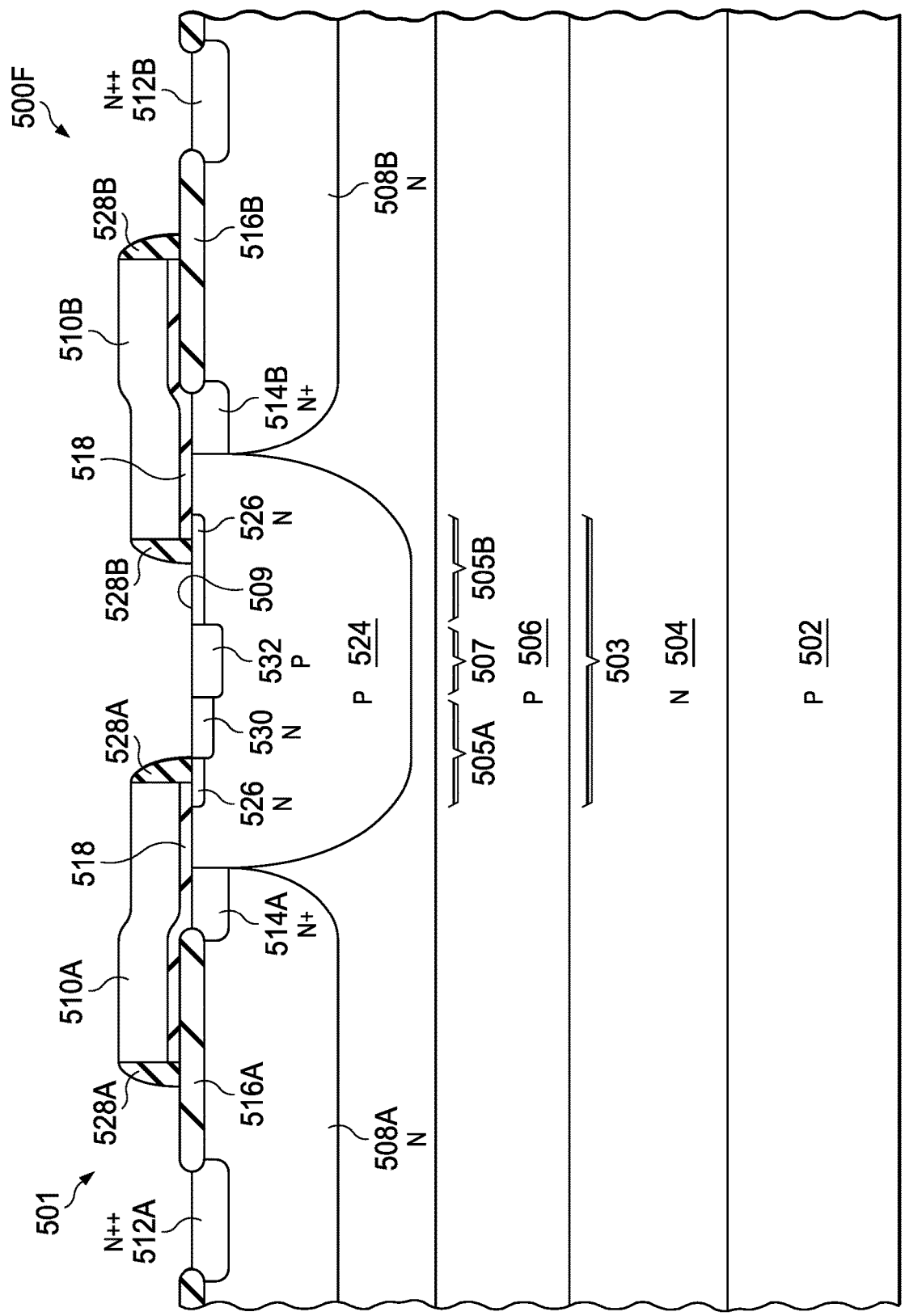

FIG. 5F depicts an IC 500F after a third mask (not specifically shown) has been formed on the upper surface 509 of the semiconductor substrate 502, with openings over intended IBG sub-regions of the source/IBG region 503. The source/drain dopants of the first conductivity type, e.g., PSD dopants, have been implanted into an IBG sub-region 532 midway between the first polysilicon gate 510A and the second polysilicon gate 510B. In one implementation, the PSD implant has at least one shallow P-type implant using boron and/or indium with a total dose of at least $5.0 \times 10^{14}$ and an implant range of at most 1000 Å. Although not evident from IC 500F, the IBG sub-region 532 extends in a direction orthogonal to the illustrated cross-section for essentially the length of the source/IBG region. A remaining portion of the second diffused well 526 is seen adjacent the second sidewall spacers 528B of the second polysilicon gate 510B. The second diffused well 526 contains only the lighter concentration of dopants of the second conductivity type and forms the lighter-doped source sub-region. The cross-section shown in FIGS. 5A-5H are patterned after the source/IBG region depicted in FIG. 2E, although other patterns can also be used to achieve the claimed method, such as the pattern depicted in FIG. 2D. In other cross-sections of IC 500F taken at different points along the source/IBG region 503 may depict the heavier-doped source sub-region 530 as being adjacent the second sidewall spacers 528B of the second polysilicon gate 510B, rather than adjacent the sidewall spacers of the first polysilicon gate 510A as seen in FIG. 5F.

Figure 5G:
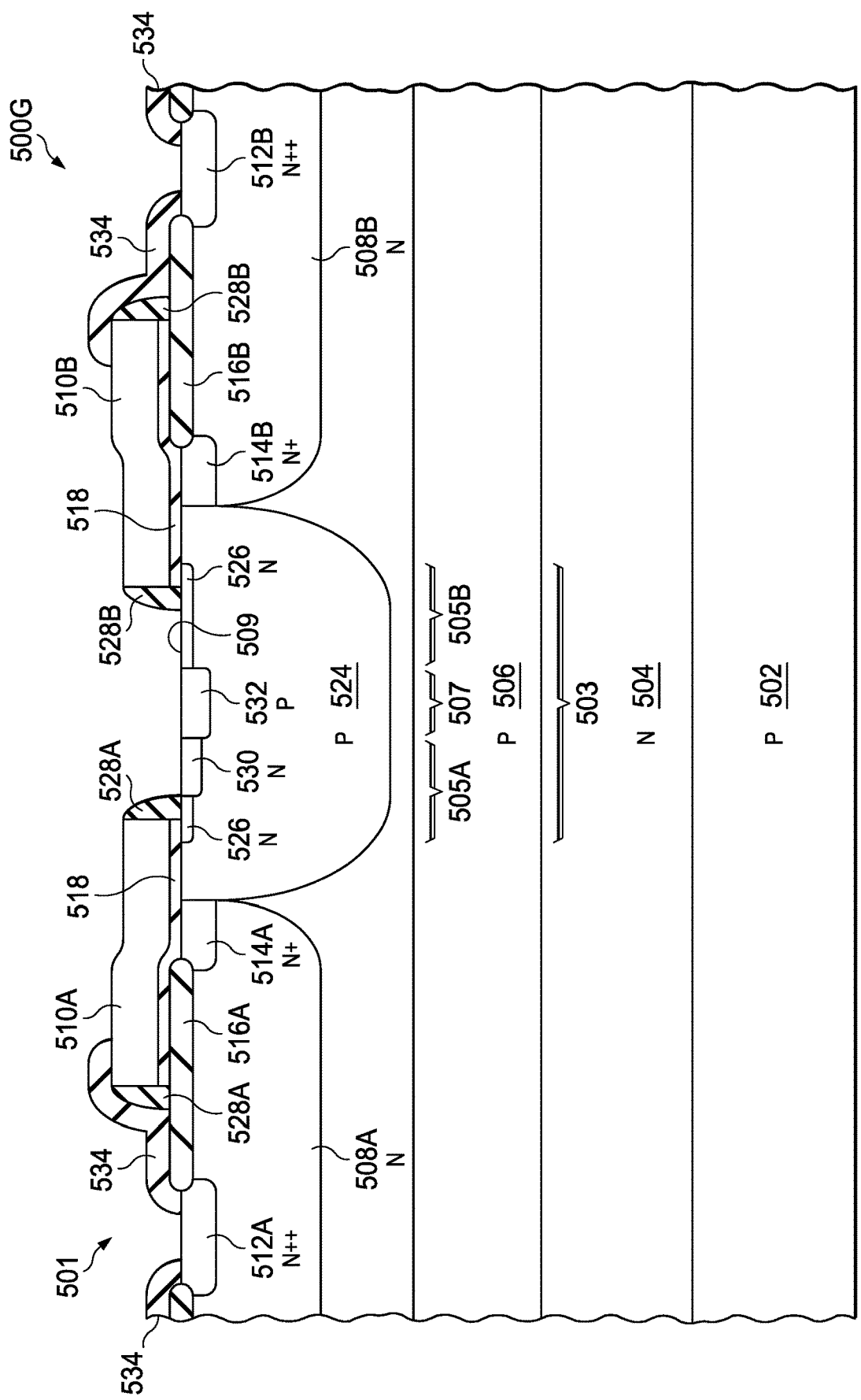

FIG. 5G depicts an IC 500G that now includes a protection layer 534, e.g. SiN, which may be added to provide control of silicide formation on the integrated circuit. In the implementation shown in IC 500G, the protection layer 534 extends from the first polysilicon gate 510A, across the first field relief oxide 516A to the first drain contact region 512A and from the second polysilicon gate 510B, across the second field relief oxide 516B to the second drain contact region 512B. Once the protection layer 534 is in place, a layer of silicide (not specifically shown) can be formed on the exposed portions of the upper surface 509 of the semiconductor substrate 502.

Figure 5H:
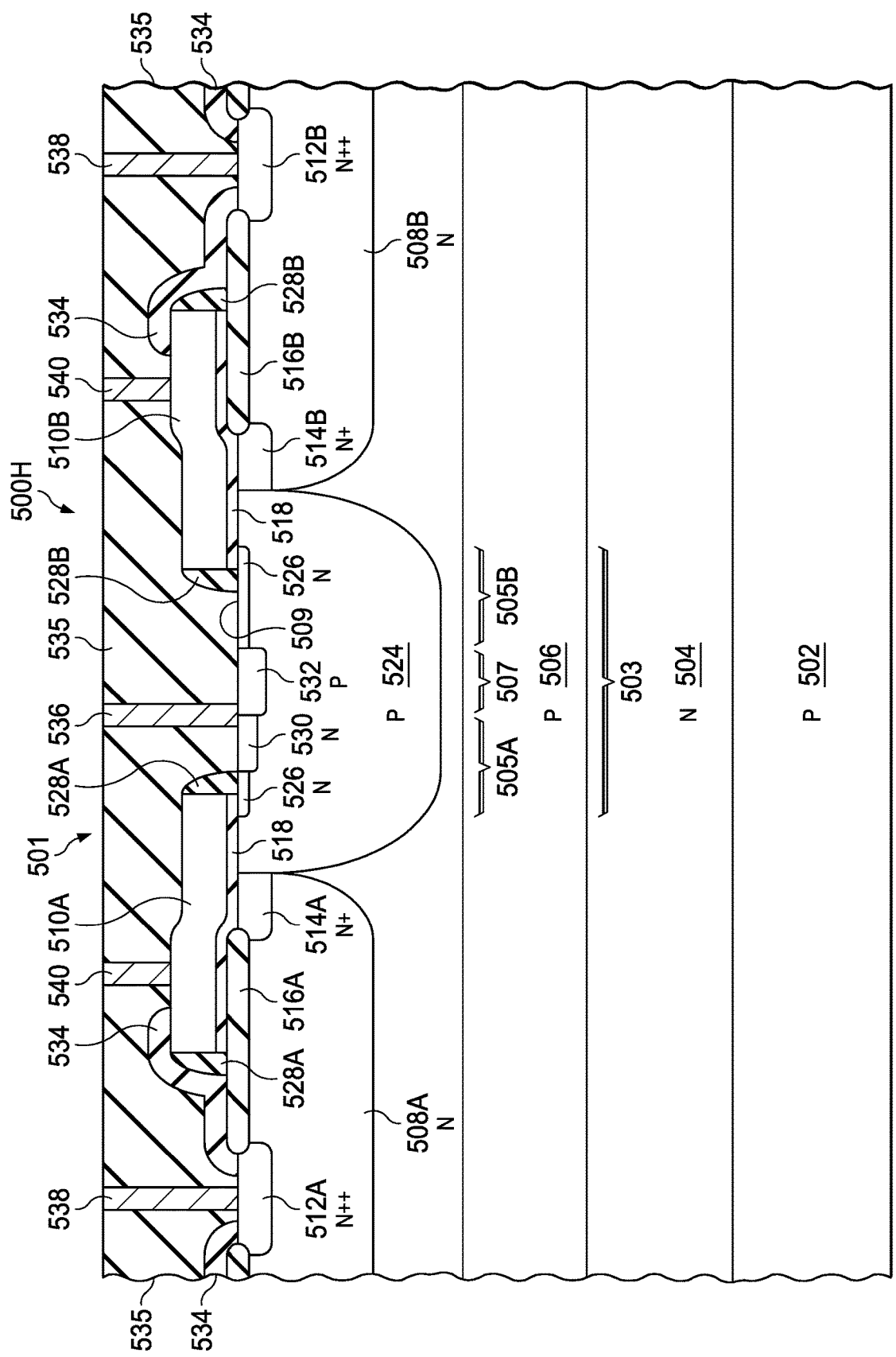

FIG. 5H depicts an IC 500H in a final stage in the formation of the source/IBG region. In IC 500H, a pre-metal dielectric 535 has been formed over the surface of the semiconductor substrate 502 and contacts to the structures of the LDMOS transistor have been formed, including source/IBG contacts 536 (only one is shown), drain contacts 538, and gate contacts 540. Unlike the drain contacts 538, which are generally centered on the respective drain contact region 512, the source/IBG contact 536 that is shown in the IC 500H is offset from the center of the source/IBG region 503. The source/IBG contact 536 has been placed in contact with both the heavier-doped source sub-region 530 and with the IBG sub-region 532 of the source/IBG region 503, where the source/IBG contact 536 straddles the PN junction. The ability for a current to easily cross the PN junction keeps the base and source of the LDMOS transistor at similar voltages and decreases the likelihood of turning on the parasitic NPN BJT. Depending on a specific doping pattern and arrangement of the source/IBG contacts, not all of the source/IBG contacts may be located over a PN junction of the source/IBG region 503.

Figure 6:
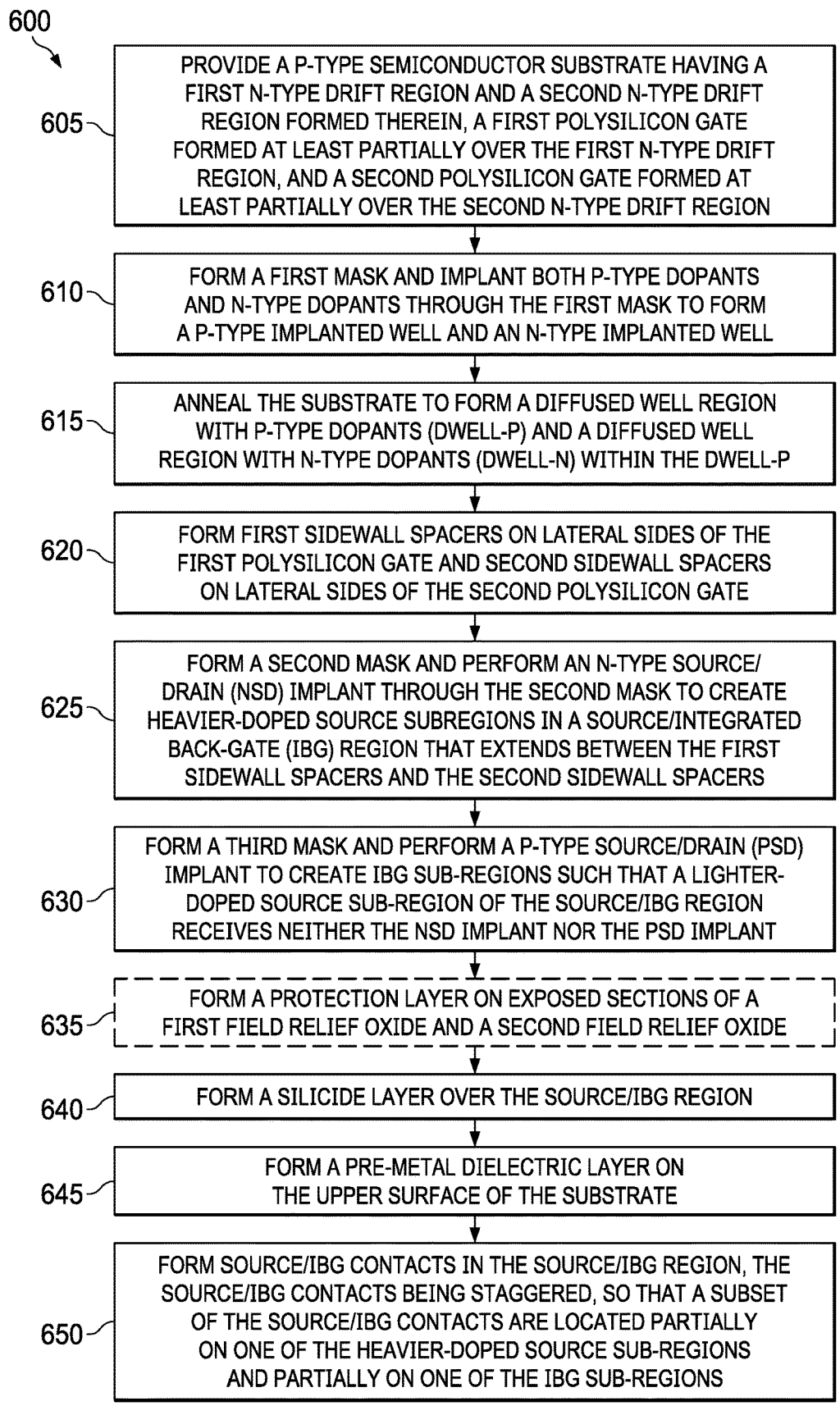
FIG. 6 depicts a method of fabricating an integrated circuit that contains an LDMOS transistor according to an implementation of the disclosure.
Figure 6A:
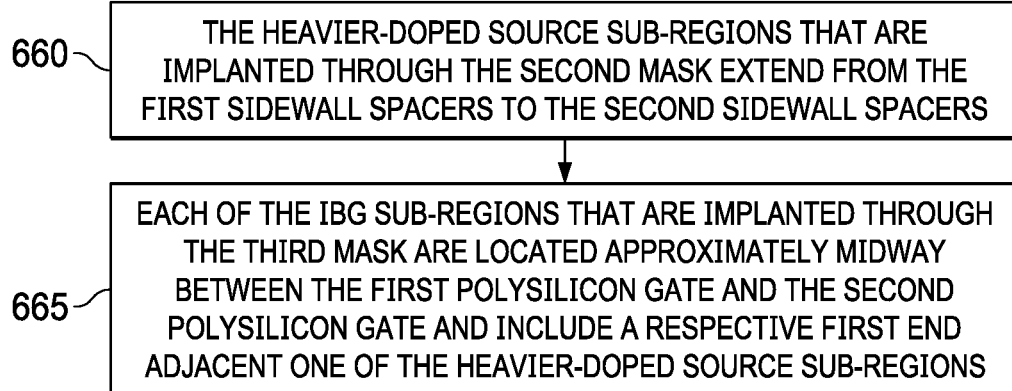
FIGS. 6A-6B provide further details for implementations of the method of FIG. 6.
Figure 6B:
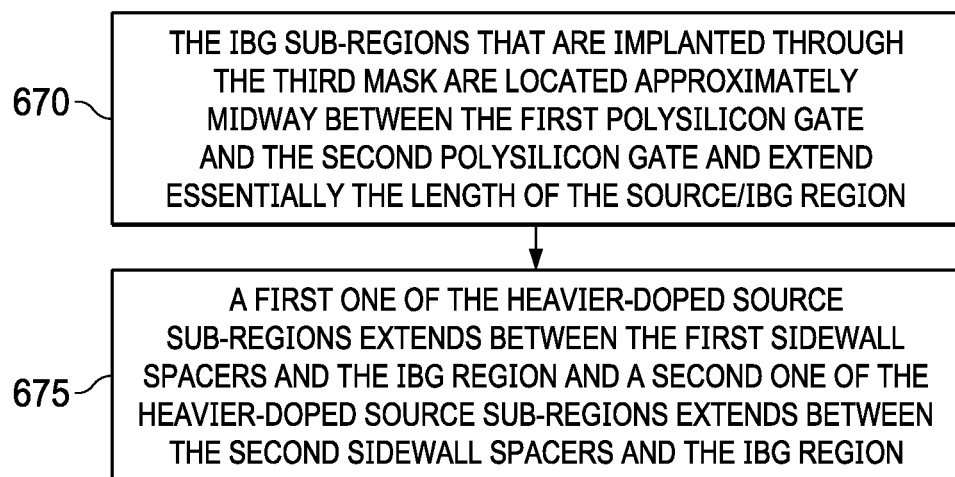

FIG. 6 depicts a method 600 of fabricating an integrated circuit that includes an N-type LDMOS transistor according to an implementation of the disclosure and FIGS. 6A-6B depicts additional details that may be part of the method of FIG. 6. The method 600 begins with providing 605 a P-type semiconductor substrate that has a first drift region and a second drift region located at a first surface thereof; both of first drift region and the second drift region are N-type. A first polysilicon gate is located at least partially over the first drift region and a second polysilicon gate is located at least partially over the second drift region. Typically, the first drift region contains a first drain contact region, a first drift contact region, and a first field relief oxide that extends between the first drain contact region and the first drift contact region; and the second drift region contains a second drain contact region, a second drift contact region, and a second field relief oxide that extends between the second drain contact region and the second drift contact region. The first polysilicon gate and the second polysilicon gate will also extend partially over a body region that will become respective channels. This is the scenario shown in FIG. 5A.

A first mask is formed 610 and both dopants of the first conductivity type and dopants of the second conductivity type are implanted through the first mask to form a first implanted well that is P-type, and a second implanted well that is N-type, as shown in FIG. 5B. In one implementation, boron is used as the P-type dopant and arsenic is used as the N-type dopant. The method 600 continues with annealing 615 the substrate to form a first diffused well that is P-type and a second diffused well that is N-type. In implementations in which boron and arsenic are used as the dopants, the boron, which is a small molecule, will migrate much further than the arsenic, which is a much larger molecule, as shown in FIG. 5C.

The method 600 continues with forming 620 first sidewall spacers on lateral sides of the first polysilicon gate and second sidewall spacers on lateral sides of the second polysilicon gate, shown in FIG. 5D. The method 600 forms a second mask on the surface of the substrate and performs 625 an NSD implant through the second mask, creating heavier-doped source sub-regions in a source/IBG region, which extends between the first sidewall spacers and the second sidewall spacers, as shown in FIG. 5E. The location (s) of the heavier-doped source sub-regions will depend on the specific design of the second mask.

The method 600 forms a third mask and performs 630 a PSD implant, creating IBG sub-regions of the source/IBG region, as shown in FIG. 5F. The location(s) of the IBG sub-regions will again depend on the specific design of the third mask, but the locations of the heavier-doped source sub-regions and of the IBG sub-regions will define lighter-doped source sub-regions of the source/IBG region which receive neither the NSD implant nor the PSD implant. The concentration of dopants in both the heavier-doped source sub-regions and the IBG sub-regions is high enough to allow respective ohmic connections to a surface silicide, e.g., a first concentration of at least $10^{20}$ cm$^3$. FIG. 6A and FIG. 6B each provide details for fabricating an example of doping for the source/IBG region.

Prior to forming a self-aligned silicide, the method optionally forms 635 a protection layer on exposed sections of the first field relief oxide and the second field relief oxide, which prevents the formation of silicide on the first field relief oxide and the second field relief oxide while the silicide layer is formed over the source/IBG region. The method then forms 640 a silicide layer over the source/IBG region, where the silicide may provide better conduction to the source regions and to the IBG region. The protection layer is seen in FIG. 5G, although the silicide layer is not shown. The method forms 645 a pre-metal dielectric on the upper surface of the substrate, e.g., by deposition, and forms 650 source/IBG contacts in the source/IBG region; other contacts may be formed at the same time. In one implementation, the source/IBG contacts are staggered, so that a subset of the source/IBG contacts are located partially on one of the heavier-doped source sub-regions and partially on one of the IBG sub-regions. Depending on the specific doping pattern and contact layout used, the subset of the source/IBG contacts that contact both the heavier-doped source sub-regions and the IBG sub-regions can contain most of the source/IBG contacts or may contain a smaller number.

FIG. 6A depicts additional details for fabricating the IC when the included LDMOS transistor provides the source/IBG region with a pattern similar to the pattern shown in FIG. 2D. The heavier-doped source sub-regions that are implanted through the second mask extend 660 from the first sidewall spacer to the second sidewall spacer. Similarly, the IBG sub-regions that are implanted through the third mask are located 665 approximately midway between the first polysilicon gate and the second polysilicon gate and include a first end adjacent one of the heavier-doped source sub-regions.

FIG. 6B depicts additional details for fabricating the IC when the included LDMOS transistor provides the source/IBG region with a pattern similar to the pattern shown in FIG. 2E. The IBG sub-regions that are implanted through the third mask are located 670 approximately midway between the first polysilicon gate and the second polysilicon gate and extend essentially the length of the source/IBG region. Similarly, a first one of the heavier-doped source sub-regions that are implanted through the second mask extends 675 between the first sidewall spacer and the IBG sub-regions and a second one of the heavier-doped source sub-regions extends between the second sidewall spacer and the IBG sub-regions.

Applicant has disclosed an IC containing an LDMOS transistor and a method of fabricating the IC. An N-type LDMOS transistor contains a source/IBG region in which portions of the source region contain N-type doping with a second concentration that is less than the first concentration, e.g. less than about $10^{20}$ atoms per cm$^3$, and has a junction depth of less than about 0.1 microns. Typically, greater concentrations of N-type dopants are found in the source region as a result of receiving NSD implants that are performed in the course of fabricating NMOS transistors on the wafer, although the greater concentrations can be also provided at other stages in the fabrication. Providing portions of the source that lack the heavier N-type doping prevents some of the counter-doping of the body region that occurs while providing the NSD implants and decreases the likelihood that a parasitic NPN BJT is triggered during exceptional conditions, such as load transients, short currents, and negative current flow.

Although various implementations have been shown and described in detail, the claims are not limited to any particular implementation or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described implementations that are known to those of ordinary skill in the art are expressly incorporated herein by reference and are intended to be encompassed by the present claims. Accordingly, those skilled in the art will recognize that the exemplary implementations described herein can be practiced with various modifications and alterations within the spirit and scope of the claims appended below.

What is claimed is:

1. An integrated circuit (IC), comprising:
 a gate electrode over a semiconductor layer having a first conductivity type;
 a drain drift region within the semiconductor layer extending from a drain region to under a first side of the gate electrode, the drain drift region and the drain region having an opposite second conductivity type and the drain region having a first dopant concentration; and
 a source region having the second conductivity type within the semiconductor layer, the source region having a first subregion extending under an opposing second side of the gate electrode and having a second dopant concentration, and a second subregion that touches the first subregion and has a third dopant concentration less than the first dopant concentration and makes a conductive connection to an electrical contact at a top surface of the source region.

2. The IC as recited in claim 1, wherein the source region is located within a well region having the first conductivity type, the well region touching the drain drift region under the gate electrode.

3. The IC as recited in claim 1, wherein the second dopant concentration equals the third dopant concentration.

4. The IC as recited in claim 1, wherein the source region has a dopant concentration no greater than $10^{20}$ cm$^{-3}$.

5. The IC as recited in claim 2, wherein the second subregion touches the first subregion and an implant region having the first conductivity type that extends to a surface of the well region.

6. The IC as recited in claim 5, wherein the implant region is bounded on first and second opposing sides by the source region and bounded on third and fourth opposing sides by doped regions having the second conductivity type and the first dopant concentration.

7. The IC as recited in claim 6, wherein the gate electrode includes first and second parallel segments, and the doped regions extend from the first segment to the second segment.

8. The IC as recited in claim 2, further comprising a doped region having the second conductivity type that extends to a surface of the well region, wherein the second subregion touches the first subregion and the doped region.

9. The IC as recited in claim 2, further comprising a first doped region having the second conductivity type that extends to a surface of the well region, and a second doped region having the first conductivity type that extends to the surface of the well region, wherein the second subregion touches the first subregion and the second subregion.

10. The IC as recited in claim 1, wherein the first conductivity type is P-type and the second conductivity type is N-type.

11. An integrated circuit (IC), comprising:
 first and second drain contact regions extending into a semiconductor substrate and having a first conductivity type and first dopant concentration;
 first and second gate electrodes over the semiconductor substrate and located between the first and second drain contact regions;
 a backgate contact region having an opposite second conductivity type between the first and second gate electrodes; and
 a source region having the first conductivity type extending from the first gate electrode to a backgate contact at a top surface of the backgate contact region, the source region having a dopant concentration less than the first dopant concentration.

12. The IC as recited in claim 11, wherein the source region is located within a well region having the second conductivity type, the well region extending from under the first gate electrode to under the second gate electrode.

13. The IC as recited in claim 11, wherein the source region includes a first source sub-region that extends from under the first gate electrode toward the backgate contact region and a second source sub-region that extends from the backgate contact region to the first source sub-region.

14. The IC as recited in claim 13, wherein the first source sub-region has a dopant concentration no greater than $10^{20}$ cm$^{-3}$ and the second source sub-region has a dopant concentration greater than $10^{20}$ cm$^{-3}$.

15. The IC as recited in claim 11, wherein the backgate contact region is bounded on first and second opposing sides by the source region and is bounded on third and fourth opposing sides by doped regions having the first conductivity type and the first dopant concentration.

16. The IC as recited in claim 15, wherein the doped regions extend from the first gate electrode to the second gate electrode.

17. The IC as recited in claim 11, wherein the source region is a first source region, and further comprising a second source region having the first conductivity type and a dopant concentration less than the first dopant concentration and extending from the second gate electrode toward the backgate contact region.

18. The IC as recited in claim 17, further comprising a doped region having the first conductivity type and the first dopant concentration that touches the first and second source regions and extends from the first gate electrode to the second gate electrode.

19. The IC as recited in claim 17, further comprising a third source region having the first conductivity type and a dopant concentration less than the first dopant concentration and extending from the second gate electrode toward the backgate contact region, and a doped region having the first conductivity type and the first dopant concentration extends from the second gate electrode toward the backgate contact region between the second and third source regions.

20. The IC as recited in claim 11, wherein the first conductivity type is N-type and the second conductivity type is P-type.

* * * * *